(12) United States Patent
Okada

(10) Patent No.: US 9,588,256 B2
(45) Date of Patent: *Mar. 7, 2017

(54) COLOR MATERIAL DISPERSION LIQUID, COLOR RESIN COMPOSITION FOR COLOR FILTERS, COLOR FILTER, LIQUID CRYSTAL DISPLAY DEVICE AND ORGANIC LIGHT-EMITTING DISPLAY DEVICE

(75) Inventor: Masato Okada, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/112,980

(22) PCT Filed: Apr. 18, 2012

(86) PCT No.: PCT/JP2012/060463
§ 371 (c)(1),
(2), (4) Date: Oct. 21, 2013

(87) PCT Pub. No.: WO2012/144521
PCT Pub. Date: Oct. 26, 2012

(65) Prior Publication Data
US 2014/0037866 A1 Feb. 6, 2014

(30) Foreign Application Priority Data

Apr. 21, 2011 (JP) ................................ 2011-095383
Aug. 15, 2011 (JP) ................................ 2011-177729
Apr. 16, 2012 (JP) ................................ 2012-093181

(51) Int. Cl.
*G02B 5/22* (2006.01)
*G02B 1/04* (2006.01)
(Continued)

(52) U.S. Cl.
CPC ................ *G02B 1/04* (2013.01); *C09B 69/02* (2013.01); *C09D 11/322* (2013.01);
(Continued)

(58) Field of Classification Search
CPC ... C07C 309/34; C07C 309/35; C07C 251/00; G02B 5/22; G02B 5/223;
(Continued)

(56) References Cited

U.S. PATENT DOCUMENTS 4,223,144 A 9/1980 Kast et al.
5,352,740 A 10/1994 Ishidoya et al.
(Continued)

FOREIGN PATENT DOCUMENTS

JP 54-50030 A 4/1979
JP 01-269585 A 10/1989
(Continued)

OTHER PUBLICATIONS

USPTO NFOA dated May 8, 2014 in connection with U.S. Appl. No. 14/163,250
(Continued)

*Primary Examiner* — Ellen S Wood
*Assistant Examiner* — Eli D Strah
(74) *Attorney, Agent, or Firm* — Ladas & Parry LLP

(57) ABSTRACT

A color material dispersion liquid comprising a color material represented by the following general formula (I), a dispersant, and a solvent having a solubility of the color material of 0.1 (mg/10 g solvent) or less at 23° C.,
(Continued)

General Formula (I)

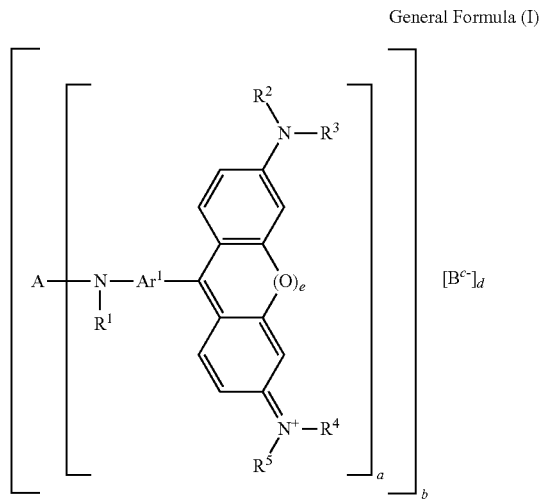

having excellent solvent resistance and excellent electrical reliability; a color resin composition for color filters, which can form a color layer that has high contrast, excellent solvent resistance and excellent electrical reliability; a color filter formed with the color resin composition for color filters; a liquid crystal display device having the color filter; and an organic light-emitting display device having the color filter.

3 Claims, 3 Drawing Sheets

(51) Int. Cl.
| | |
|---|---|
| *G02F 1/1335* | (2006.01) |
| *C09B 69/02* | (2006.01) |
| *C09D 11/326* | (2014.01) |
| *C09D 17/00* | (2006.01) |
| *G03F 7/00* | (2006.01) |
| *G03F 7/027* | (2006.01) |
| *G03F 7/105* | (2006.01) |
| *C09D 11/322* | (2014.01) |
| *H01L 27/32* | (2006.01) |

(52) U.S. Cl.
CPC .......... *C09D 11/326* (2013.01); *C09D 17/003* (2013.01); *G02B 1/041* (2013.01); *G02B 5/223* (2013.01); *G02F 1/133514* (2013.01); *G03F 7/0007* (2013.01); *G03F 7/027* (2013.01); *G03F 7/105* (2013.01); *H01L 27/322* (2013.01); *Y10T 428/1036* (2015.01); *Y10T 428/1041* (2015.01)

(58) Field of Classification Search
CPC ....................... G02B 1/04; G02B 1/041; G02F 2001/133519; G02F 2001/133521; G02F 1/1335; G02F 1/133514; C09D 11/322; C09D 11/326; C09D 17/003; G03F 7/0007; G03F 7/027; G03F 7/105; C09B 69/02; Y10T 428/1041; Y10T 428/1036; H01L 27/322
USPC ................... 428/1.3, 1.31; 252/586; 548/402; 562/86; 564/270; 349/104, 106–109; 359/491.01; 353/84
See application file for complete search history.

(56) References Cited

U.S. PATENT DOCUMENTS

| | | |
|---|---|---|
| 2005/0188894 A1 | 9/2005 | Yamagishi et al. |
| 2009/0005474 A1 | 1/2009 | Jaunky et al. |
| 2009/0233062 A1* | 9/2009 | Nakamura ................ C08F 8/00 428/195.1 |
| 2010/0192312 A1 | 8/2010 | Cremer et al. |
| 2011/0014401 A1* | 1/2011 | Fujimaki ............... C08F 265/04 428/1.33 |
| 2011/0049444 A1 | 3/2011 | Sako et al. |
| 2013/0018196 A1 | 1/2013 | Crampton |
| 2013/0018198 A1 | 1/2013 | Kondou et al. |
| 2014/0039201 A1* | 2/2014 | Okada et al. .................. 548/402 |
| 2014/0141178 A1* | 5/2014 | Okada .......................... 428/1.31 |

FOREIGN PATENT DOCUMENTS

| | | | |
|---|---|---|---|
| JP | 04-218561 A | 8/1992 | |
| JP | 2006-106503 A | 4/2006 | |
| JP | 2008-304766 A | 12/2008 | |
| JP | 2010-526897 A | 8/2010 | |
| JP | 2011-007847 A | 1/2011 | |
| JP | 2011-213925 A | 10/2011 | |
| JP | 2012-007121 A | 1/2012 | |
| JP | 2012007121 A * | 1/2012 | ............. C09B 11/28 |
| JP | 2012-032754 A | 2/2012 | |
| TW | 201206897 A | 2/2012 | |
| WO | 2008/138726 A2 | 11/2008 | |
| WO | 2009/107734 A1 | 9/2009 | |
| WO | 2011/122707 A1 | 10/2011 | |
| WO | 2011/162217 A1 | 12/2011 | |
| WO | 2012/039416 A1 | 3/2012 | |

OTHER PUBLICATIONS

Wang Hong Jun, et al; "Complete Study Phamphlet for Notebook Computer Maintenance": Science Press, Oct. 30, 2010; pp. 267-268.
Chinese Office Action issued on Nov. 4, 2014; Appln. No. 201410037371.7 (Partial Translation).
USPTO FOA dated Sep. 1, 2015 in connection with U.S. Appl. No. 14/396,217.
Masaki Jinbo; "The Epoxy Resin Handbook", Dec. 25, 1987; Nikkan Kogyo Shimbun Ltd. **Partial Translation.

* cited by examiner

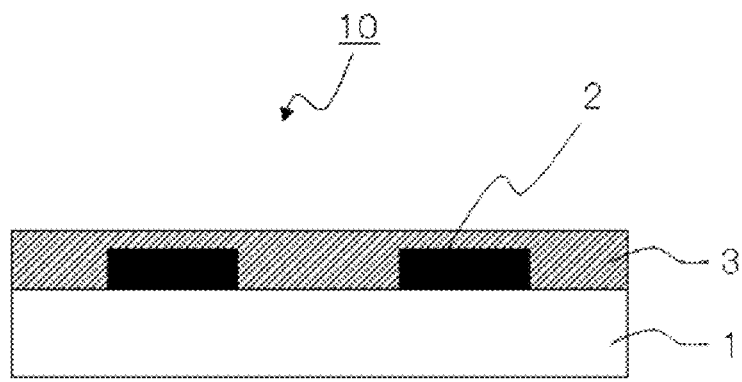
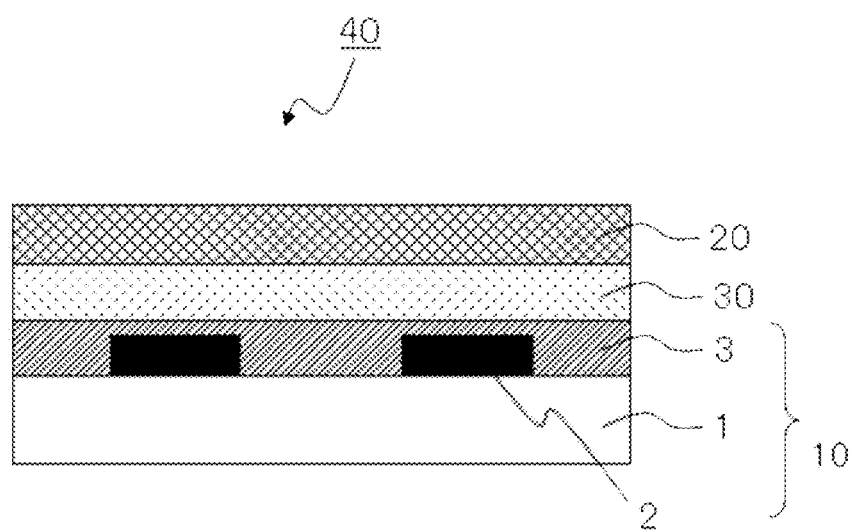

COLOR MATERIAL DISPERSION LIQUID, COLOR RESIN COMPOSITION FOR COLOR FILTERS, COLOR FILTER, LIQUID CRYSTAL DISPLAY DEVICE AND ORGANIC LIGHT-EMITTING DISPLAY DEVICE

TECHNICAL FIELD

The present invention relates to a color material dispersion liquid, a color resin composition for color filters, a color filter, a liquid crystal display device and an organic light-emitting display device.

BACKGROUND ART

In recent years, there is an increasing demand for liquid crystal displays, along with the development of personal computers, particularly the development of portable personal computers. The penetration rate of home liquid crystal displays has also increased, so that the market for liquid crystal displays is also in an expanding state. Recently, organic light-emitting display devices such as an organic EL display, which is a self-emitting display that provides high visibility, have also attracted attention as a next-generation image display device. These image display devices are required to show higher performances including higher image quality, such as better contrast and color reproducibility, and lower power consumption.

Color filters are used in these liquid crystal display devices and organic light-emitting display devices. For example, in liquid crystal display devices, light which passed through a color filter is colored in the colors of the pixels that constitute the color filter, and the colored lights are synthesized to form a color image. In organic light-emitting display devices, a color image is formed in the same manner as that of liquid crystal display devices, in the case where an organic light-emitting device, which emits white light, is used in combination with a color filter.

Under the circumstances described above, higher luminance, higher contrast and an improvement in color reproducibility are also required of color filters, increasingly.

In general, a resin composition for forming a color filter is used to form color layers of color filters, the composition comprising a pigment or dye as the color material. Compared to dies, pigments have better resistance properties, such as high heat resistance. However, sometimes color filters produced with pigments have insufficient luminance.

On the other hand, when dyes are used as the color material, color filters with high luminance can be obtained. However, the color filters have a problem with the resistance properties and contrast.

As a method of increasing the resistance properties of dyes, a method of forming a salt-forming compound has been known (for example, see Patent Literatures 1 to 3).

An example is disclosed in Patent Literature 1, in which a chloride ion or an aryl sulfate ion is used as a counter anion of a triarylmethane dye to improve heat durability of the triarylmethane dye.

In Patent Literature 2, as a method of obtaining a coloring resin composition which has not only excellent light resistance but also excellent heat resistance, a salt forming method has been reported, in which a salt is formed by using a sulfonated compound of a dye skeleton such as phthalocyanine or anthraquinone, which is the counter anion, in combination with a triarylmethane skeleton, which is the cation.

However, the salt-forming compounds described in Patent Literatures 1 and 2 are those which are basically dissolved in solvents for use. In Patent Literatures 1 and 2, therefore, no attention was paid to solvent resistance, and color filters obtained from the color resin compositions for color filters disclosed in Patent Literatures 1 and 2 showed insufficient solvent resistance, electric reliability and contrast.

In Patent Literature 3, as a method of obtaining a color composition for color filters with excellent color characteristics, heat resistance, light resistance and solvent resistance, a salt-forming compound comprising a triarylmethane basic dye and a sulfonated organic compound having at least two sulfonic groups, is disclosed. However, as will be shown below with comparative examples, the solvent resistance, electric reliability and contrast of the color filter obtained from the color composition of Patent Literature 3 were insufficient.

A polysiloxane dye is disclosed in Patent Literature 4, which is highly cross-linked by polysiloxane containing at least ten Si atoms. Due to its synthesis method, the polysiloxane dye disclosed in Patent Literature 4 is a mixture in which an unreacted compound having only one dye skeleton or dyes with different polymerization degrees are present. It is difficult to separate only a dye with a specific polymerization degree from the polysiloxane dye, so that there is a problem with the productivity of the polysiloxane dye. Since the polysiloxane dye contains a silanol group or alkoxysilyl group, a siloxane bond is formed between the polysiloxane dye(s) or between the polysiloxane dye and other component having a silanol group or alkoxysilyl group. As a result, there is a deterioration in the state of a solution or dispersion liquid comprising the polysiloxane dye, such as a change in solubility or an influence on dispersion stability, making it difficult to handle the solution or dispersion liquid. This reaction is likely to proceed especially by heating, so that the dye of Patent Literature 4 is not suitable for color filter applications. As will be shown below with comparative examples, the color filter comprising the polysiloxane dye had insufficient solvent resistance, electric reliability and contrast.

CITATION LIST

Patent Literature 1: Japanese Patent Application Laid-Open (JP-A) No. 2008-304766
Patent Literature 2: International Publication No. WO2009/107734
Patent Literature 3: JP-A No. 2011-7847
Patent Literature 4: Japanese Patent Application National Publication (Laid-Open) No. 2010-526897

SUMMARY OF INVENTION

Technical Problem

The present invention was achieved in light of the above circumstances. An object of the present invention is to provide: a color material dispersion liquid which can form a coating film that satisfies a demand for higher contrast and has excellent solvent resistance and excellent electric reliability; a color resin composition for color filters, which can form a color layer that has high contrast, excellent solvent resistance and excellent electrical reliability; a color filter formed with the color resin composition for color filters; a liquid crystal display device having the color filter; and an organic light-emitting display device having the color filter.

Solution to Problem

As the result of diligent researches made to attain the above object, the inventors of the present invention has found that it is possible to obtain a color material dispersion liquid which can form a coating film that satisfies a demand for higher contrast and has excellent solvent resistance and excellent electric reliability, with achieving higher luminance as that of dyes, by dispersing a specific color material in a solvent in which the color material is substantially insoluble or hardly soluble and using the dispersion. The present invention was completed based on this finding.

The color material dispersion liquid according to the present invention comprises a color material represented by the following general formula (I), a dispersant, and a solvent having a solubility of the color material of 0.1 (mg/10 g solvent) or less at 23° C.:

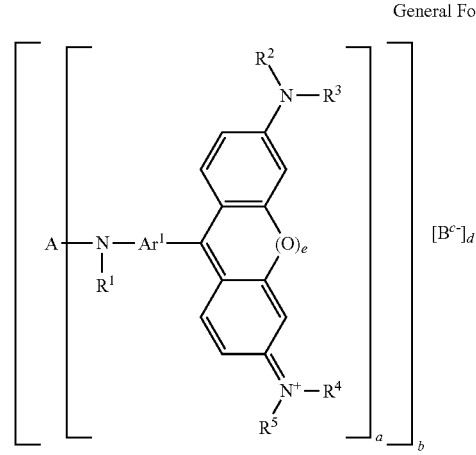

General Formula (I)

wherein A is an "a"-valent organic group in which a carbon atom directly bound to N has no π bond, and the organic group is an aliphatic hydrocarbon group having a saturated aliphatic hydrocarbon group at least at a terminal position directly bound to N, or an aromatic group having the aliphatic hydrocarbon group, and O, S, N may be contained in a carbon chain of the organic group; $B^{c-}$ is a "c"-valent anion; each of $R^1$ to $R^5$ is independently a hydrogen atom, an alkyl group which may have a substituent, or an aryl group which may have a substituent; $R^2$ and $R^3$ may be bound to form a ring structure, and/or $R^4$ and $R^5$ may be bound to form a ring structure; $Ar^1$ is a divalent aromatic group which may have a substituent; $R^1$s may be the same or different; $R^2$s may be the same or different; $R^3$s may be the same or different; $R^4$s may be the same or different; $R^5$s may be the same or different; and $Ar^1$s may be the same or different; and wherein each of "a" and "c" is an integer of 2 or more; each of "b" and "d" is an integer of 1 or more; "e" is 0 or 1 and there is no bond when "e" is 0; and "e"s may be the same or different.

In the color material dispersion liquid of the present invention, the anion ($B^{c-}$) in the general formula (I) is preferably an organic anion having a sulfonato group (—$SO_3^-$ group), from the viewpoint of increasing solvent resistance and electric reliability.

In the color material dispersion liquid of the present invention, the anion ($B^{c-}$) in the general formula (I) is preferably one or more anions selected from the group consisting of those represented by the following general formulae (II), (III) and (IV), from the viewpoint of increasing solvent resistance and electric reliability:

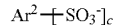

General Formula (II)

wherein $Ar^2$ is a "c"-valent aromatic group which may have a substituent, and "c" is an integer of 2 or more;

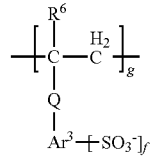

General Formula (III)

wherein $R^6$ is a hydrogen atom or a methyl group; $Ar^3$ is an aromatic group which may have a substituent; Q is a direct bond or a divalent linking group; "f" is an integer of 1 or more; and "g" is an integer of 2 or more; and

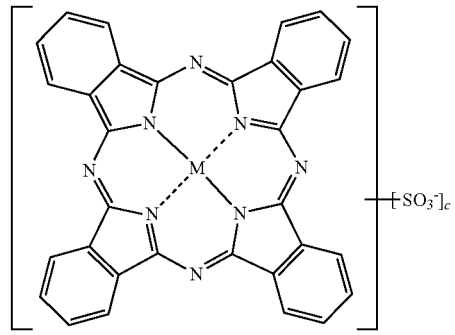

General Formula (IV)

wherein M represents two hydrogen atoms or one selected from the group consisting of Cu, Mg, Al, Ni, Co, Fe and Zn; the sulfonato group (—$SO_3^-$ group) is bound to an aromatic ring by substitution; and "c" is an integer of 2 to 4.

Also in the color material dispersion liquid of the present invention, the anion ($B^{c-}$) in the general formula (I) is preferably an anion of an inorganic acid containing molybdenum and/or tungsten, from the viewpoint of increasing solvent resistance and electric reliability.

In the color material dispersion liquid of the present invention, "a" in the general formula (I) is preferably 4 or less, from the viewpoint of ease of production.

In the color material dispersion liquid of the present invention, the solvent is preferably an ester solvent, from the point of view that the color material is substantially insoluble in such a solvent and from the viewpoint of solubility of other components and coatability.

In the color material dispersion liquid of the present invention, the dispersant is preferably a polymer dispersant in which a nitrogen atom is contained in a main or side chain thereof, from the viewpoint of increasing solvent resistance and electric reliability and also increasing the dispersibility and dispersion stability of the color material.

The color resin composition for color filters according to the present invention comprises at least the color material dispersion liquid of the present invention, a binder component and a solvent. Due to containing the color material dispersion liquid of the present invention, the color resin composition of the present invention can form a color layer which is able to achieve higher contrast and has excellent solvent resistance and electric reliability.

The present invention also provides a color filter comprising at least a transparent substrate and color layers present on the substrate, wherein at least one of the color layers is a color layer which is a cured product of the color resin composition described above.

The present invention also provides a liquid crystal display device comprising the above-described color filter, a counter substrate, and a liquid crystal layer present between the color layer and the counter substrate.

Furthermore, the present invention provides an organic light-emitting display device comprising the above-described color filter and an organic light-emitting material.

Advantageous Effects of Invention

According to the present invention, it is possible to provide a color material dispersion liquid which can form a coating film that satisfies a demand for higher contrast and has excellent solvent resistance and excellent electric reliability; a color resin composition for color filters, which can form a color layer that has high contrast, excellent solvent resistance and excellent electrical reliability; a color filter formed with the color resin composition for color filters; a liquid crystal display device having the color filter; and an organic light-emitting display device having the color filter.

BRIEF DESCRIPTION OF DRAWINGS

FIG. 1 is a schematic view showing an example of the color filter of the present invention.

FIG. 2 is a schematic view showing an example of the liquid crystal display device of the present invention.

DESCRIPTION OF EMBODIMENTS

Hereinafter, the color material dispersion liquid, color resin composition for color filters, color filter, liquid crystal display device and organic light-emitting display device of the present invention, will be described in order.

In the present invention, "light" encompasses electromagnetic waves in visible and non-visible wavelength ranges and radial rays. Radial rays include microwaves and electron beams, more specifically, electromagnetic waves having a wavelength of 5 μm or less and electron beams. Also in the present invention, "(meth)acryl" means any one of acryl and methacryl, and "(meth)acrylate" means any one of acrylate and methacrylate.

[Color Material Dispersion Liquid]

The color material dispersion liquid of the present invention comprises a color material represented by the following general formula (I), a dispersant, and a solvent having a solubility of the color material of 0.1 (mg/10 g solvent) or less at 23° C.:

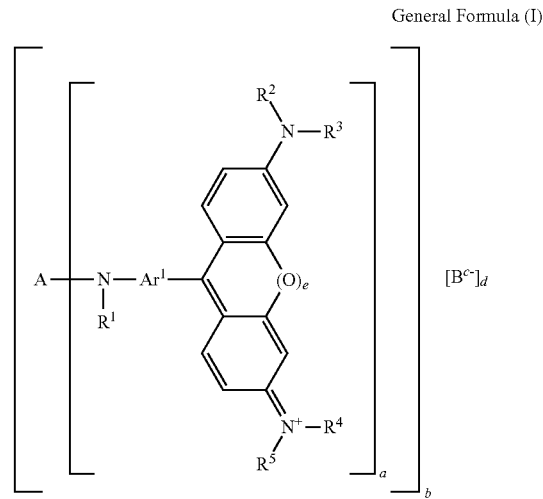

General Formula (I)

wherein A is an "a"-valent organic group in which a carbon atom directly bound to N has no π bond, and the organic group is an aliphatic hydrocarbon group having a saturated aliphatic hydrocarbon group at least at a terminal position directly bound to N, or an aromatic group having the aliphatic hydrocarbon group, and O, S, N may be contained in a carbon chain of the organic group; $B^{c-}$ is a "c"-valent anion; each of $R^1$ to $R^5$ is independently a hydrogen atom, an alkyl group which may have a substituent, or an aryl group which may have a substituent; $R^2$ and $R^3$ may be bound to form a ring structure, and/or $R^4$ and $R^5$ may be bound to form a ring structure; $Ar^1$ is a divalent aromatic group which may have a substituent; $R^1$s may be the same or different; $R^2$s may be the same or different; $R^3$s may be the same or different; $R^4$s may be the same or different; $R^5$s may be the same or different; and $Ar^1$s may be the same or different; and wherein each of "a" and "c" is an integer of 2 or more; each of "b" and "d" is an integer of 1 or more; "e" is 0 or 1 and there is no bond when "e" is 0; and "e"s may be the same or different.

The color material dispersion liquid of the present invention is a color material dispersion liquid which can form a coating film that satisfies a demand for higher contrast and has excellent solvent resistance and excellent electric reliability, with achieving higher luminance as that of dyes. The color material dispersion liquid is obtained by dispersing a combination of the color material represented by the general formula (I) and a dispersant in a solvent in which the color material is substantially insoluble or hardly soluble and using the dispersion.

The mechanism of production of these effects by the above-specified combination is not understood yet; however, it is estimated as follows.

Figure 5:
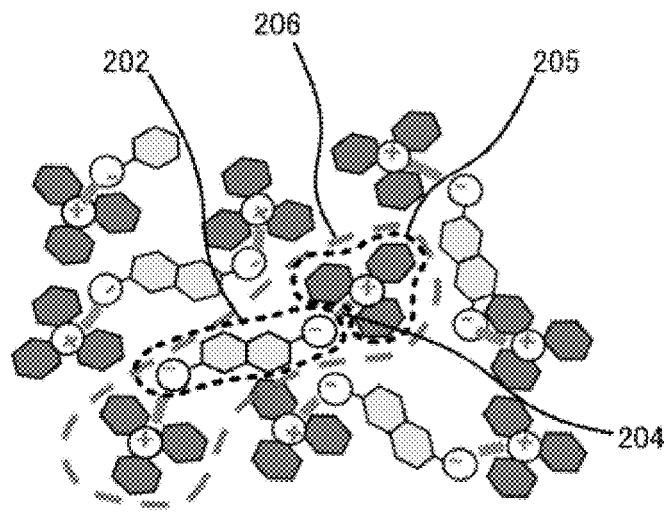
FIG. 5 is a schematic view showing ionic bonds of a conventional dye salt-forming compound.

In general, dyes are freely soluble in solvents. To decrease the solubility, a method of making dyes into a salt-forming compound has been used. For example, as a method of forming a salt with a triarylmethane dye, there is a method of using a divalent anion as a counter anion (for example, Patent Literature 3). According to this method, as shown in FIG. 5, a divalent counter anion 202 can form ionic bonds 204 with two dye cations 205, so that solubility in solvent is further decreased compared to the case of using only a dye. However, even in the color layer comprising the salt-forming compound obtained by such a method, sometimes the dye is dissolved by the solvent used in subsequent processes such as an orientation layer-forming process, resulting in a decrease in electric reliability. Also, interfusion of ionic purities in liquid crystal cells can be a possible cause of problems such as ghosting.

Figure 4:
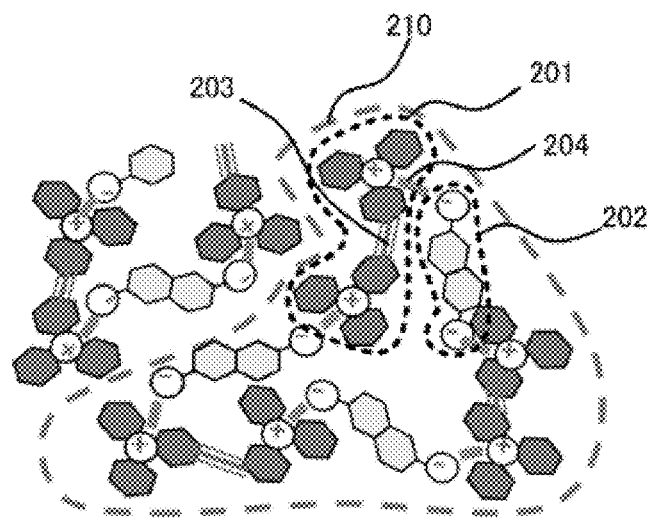
FIG. 4 is a schematic view showing a molecular association state of the color material of the present invention.

As shown in FIG. 4, as well as divalent or higher counter anions 202, the color material represented by the general formula (I) of the present invention has divalent or higher counter cations 201, in which two or more cationic color-forming moieties are bound through linkage 203 by A. For example, in the case where both anions and cations are divalent ions, it is assumed that in the aggregate of the color material, each of the anions and each of the cations do not merely form an ionic bond on a one molecule-to-one molecule (one-to-one) basis, but a molecular association 210 is formed, in which plural molecules are continuously connected through ionic bonds and associated, as shown in FIG. 4. The molecular association 210 behaves like one molecule in the aggregate of the color material, so that the apparent molecular weight of the molecular association is significantly more than the molecular weight of the conventional salt-forming compound. In addition, the formation of the molecular association 210 makes the cohesion in a solid state higher, thus decreasing the motion by heat and increasing the electric stability. Therefore, it is assumed that the dissociation of the ion pairs and the decomposition of the cationic moieties can be inhibited. As a result, it is estimated that there in an increase in the solvent resistance of the color material represented by the general formula (I), resulting in an increase in the solvent resistance and electric reliability of the color filter comprising the color material. Also, fine particles composed of molecular associations in which molecules are associated through ionic bonds have low mobility of the ion pairs, so that it is possible to inhibit a decrease in contrast, which is caused by re-aggregation of the fine particles.

In the color material represented by the general formula (I), among the hydrocarbons of linking group A, the hydrocarbon that is directly bound to the cationic color-forming moiety has no π bond; therefore, there is almost no change in the color characteristics of the cationic color-forming moiety, such as color tone and transmittance, before and after the introduction of the linking group A.

Figure 6:
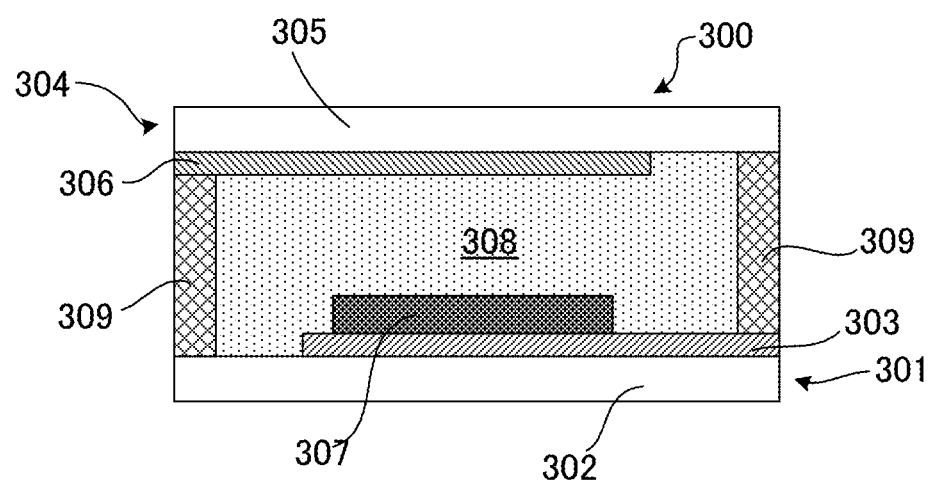
FIG. 6 is a schematic sectional view of a liquid crystal cell for measurement.

Electric reliability can be evaluated by the voltage holding ratio of a liquid crystal cell as shown in FIG. 6, which is produced by using the color resin composition for color filters. Higher electric reliability means higher voltage holding ratio. When the electric reliability is low, a given voltage is not impressed to the liquid crystal layer and there are problems such as a decrease in the contrast of the liquid crystal cell.

The color material dispersion liquid of the present invention comprises at least a color material, a dispersant and a solvent, and it may comprise other components, as needed.

Hereinafter, the components of the color material dispersion liquid of the present invention will be described in order and in detail.

(Color Material)

The color material used in the present invention is a compound represented by the following general formula (I):

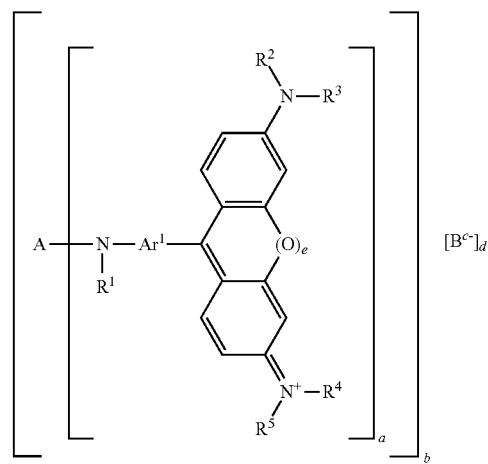

General Formula (I)

wherein A is an "a"-valent organic group in which a carbon atom directly bound to N has no π bond, and the organic group is an aliphatic hydrocarbon group having a saturated aliphatic hydrocarbon group at least at a terminal position directly bound to N, or an aromatic group having the aliphatic hydrocarbon group, and O, S, N may be contained in a carbon chain of the organic group; $B^{c-}$ is a "c"-valent anion; each of $R^1$ to $R^5$ is independently a hydrogen atom, an alkyl group which may have a substituent, or an aryl group which may have a substituent; $R^2$ and $R^3$ may be bound to form a ring structure, and/or $R^4$ and $R^5$ may be bound to form a ring structure; $Ar^1$ is a divalent aromatic group which may have a substituent; $R^1$s may be the same or different; $R^2$s may be the same or different; $R^3$s may be the same or different; $R^4$s may be the same or different; $R^5$s may be the same or different; and $Ar^1$s may be the same or different; and wherein each of "a" and "c" is an integer of 2 or more; each of "b" and "d" is an integer of 1 or more; "e" is 0 or 1 and there is no bond when "e" is 0; and "e"s may be the same or different.

High contrast, excellent solvent resistance and excellent electric reliability can be provided to color layers of color filters by using the color material of the general formula (I).

The cationic moiety of the color material used in the present invention is a divalent or higher cation having a structure represented by the following general formula (V). Unlike the conventional triarylmethane basic dyes and xanthene basic dyes, even a chloride of the cationic moiety represented by the following general formula (V) does not substantially dissolve in water.

The structure represented by the following general formula (V) refers to a divalent or higher cation, in which cations each containing only one conventional triarylmethane skeleton are bound through "a"-valent covalent bonds.

If it is considered that the binding species connecting a monocation consisting of only one conventional triarylmethane skeleton and an anion is an ionic bond only, it can be considered that the binding species of the salt-forming component consisting of the divalent or higher cation of the present invention includes covalent bonds which connect monocations in addition to ionic bonds. Therefore, it is assumed that since the salt-forming component comprising the divalent or higher cation having the structure represented by the following general formula (V) contains an increased amount of stronger binding species throughout the constituent elements compared to the conventional salt-forming component comprising one triarylmethane skeleton only, there is an increase in the stability of the salt-forming component and the component hardly cause hydration. Furthermore, it is assumed that since the molecular weight and hydrophobicity of the structure represented by the following general formula (V) are increased due to the linking group A, the divalent or higher cation becomes substantially insoluble in water, in cooperation with an increase in the stability of bonds.

General Formula (V)

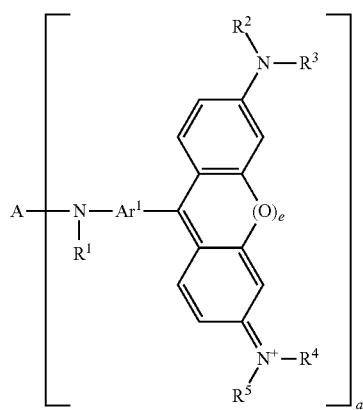

In this formula, A, $R^1$ to $R^5$, $Ar^1$, "a" and "e" are the same as those in the general formula (I).

In the general formula (I), "e" is an integer of 0 or 1. When "e" is 0, the present invention has a triarylmethane skeleton represented by the following general formula (VI):

General Formula (VI)

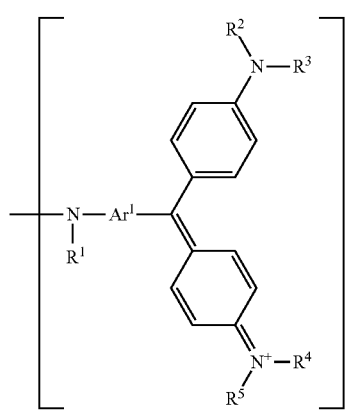

wherein $R^1$ to $R^5$ and $Ar^1$ are the same as those in the general formula (I).

When "e" is 1, the present invention has a xanthene skeleton represented by the following general formula (VII):

General Formula (VII)

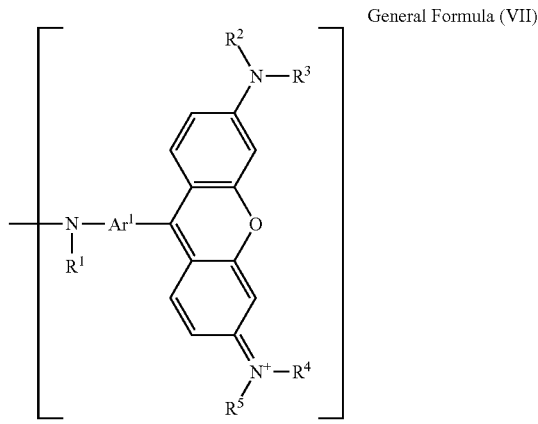

wherein $R^1$ to $R^5$ and $Ar^1$ are the same as those in the general formula (I).

In the general formula (I), "e"s may be the same or different. The examples include a cationic moiety having a plurality of triarylmethane or xanthene skeletons only, and a cationic moiety having both triarylmethane and xanthene skeletons per molecule. From the viewpoint of color purity, the cationic moiety having the same skeletons only is preferable. On the other hand, by having the cationic moiety including both triarylmethane and xanthene skeletons, or depending on the combination of substituents that will be described hereinafter, it is possible to adjust the color of the color material represented by the general formula (I) to a desired color.

In the general formula (I), A is an "a"-valent organic group in which a carbon atom directly bound to N (nitrogen atom) has no π bond. The organic group is an aliphatic hydrocarbon group having a saturated aliphatic hydrocarbon group at least at a terminal position directly bound to N, or an aromatic group having the aliphatic hydrocarbon group, and O (oxygen atom), S (sulfur atom), N (nitrogen atom) may be contained in a carbon chain of the organic group. Since the carbon atom directly bound to N has no π bond, the color characteristics of the cationic color-forming moiety, such as color tone and transmittance, are not affected by the linking group A and other color-forming moieties, thereby allowing the same color as that of a single color-forming moiety.

In A, as long as the carbon atom being at the terminal position and directly bound to N has no π bond, the aliphatic hydrocarbon group having a saturated aliphatic hydrocarbon group at least at a terminal position directly bound to N, may be in a linear, branched or cyclic form, have an unsaturated bond in carbon atoms except the one in the terminal position, have a substituent, or contain O, S, N in the carbon chain. For example, a carbonyl group, a carboxyl group, an oxycarbonyl group and/or an amide group may be contained, a hydrogen atom may be substituted with a halogen atom, etc.

Also in A, as the aromatic group having an aliphatic hydrocarbon group, there may be exemplified a monocyclic or polycyclic aromatic group which has an aliphatic hydrocarbon group having a saturated aliphatic hydrocarbon group at least at the terminal position directly bound to N. The aromatic group may have a substituent, and it may be a heterocyclic ring containing O, S or N.

Particularly, from the viewpoint of skeleton toughness, it is preferable that A contains a cyclic aliphatic hydrocarbon group or an aromatic group.

As the cyclic aliphatic hydrocarbon group, a bridged alicyclic hydrocarbon group is particularly preferable from the viewpoint of skeleton toughness. The bridged alicyclic hydrocarbon group refers to a polycyclic aliphatic hydrocarbon group having a bridged structure in the aliphatic ring and having a polycyclic structure. The examples include norbornane, bicyclo[2,2,2]octane and adamantane. Of bridged alicyclic hydrocarbon groups, norbornane is preferable. Examples of the aromatic group include groups containing a benzene ring and those containing a naphthalene ring. Of them, groups containing a benzene ring are preferable.

From the viewpoint of availability of raw materials, "A" is preferably divalent. When A is a divalent organic group, examples of the divalent organic group include a linear, branched or cyclic alkylene group having 1 to 20 carbon atoms, and an aromatic group in which two alkylene groups each having 1 to 20 carbon atoms are bound by substitution, such as a xylylene group.

The alkyl group at each of $R^1$ to $R^5$ is not particularly limited. Examples of the alkyl group include a linear or branched alkyl group having 1 to 20 carbon atoms. Of them, preferred is a linear or branched alkyl group having 1 to 8 carbon atoms, more preferred is a linear or branched alkyl group having 1 to 5 carbon atoms, from the viewpoint of ease of production and availability of raw materials. Of them, still more preferred is an ethyl group or a methyl group. A substituent that the alkyl group may have is not particularly limited. The examples include an aryl group, a halogen atom and a hydroxyl group. As the substituted alkyl group, a benzyl group can be exemplified.

The aryl group at each of $R^1$ to $R^5$ is not particularly limited. The examples include a phenyl group and a naphthyl group. As a substituent that the aryl group may have, an alkyl group and a halogen atom can be exemplified.

"$R^2$ and $R^3$ may be bound to form a ring structure, and/or $R^4$ and $R^5$ may be bound to form a ring structure" means that $R^2$ and $R^3$ form a ring structure through a nitrogen atom and/or $R^4$ and $R^5$ form a ring structure through a nitrogen atom. The ring structure is not particularly limited, and the examples include a pyrrolidine ring, a piperidine ring and a morpholine ring.

Particularly, from the viewpoint of chemical stability, it is preferable that each of $R^1$ to $R^5$ is independently a hydrogen atom, an alkyl group having 1 to 5 carbon atoms, or a phenyl group. Or, it is preferable that $R^2$ and $R^3$ are bound to form a pyrrolidine ring, a piperidine ring or a morpholine ring, and/or $R^4$ and $R^5$ are bound to form a pyrrolidine ring, a piperidine ring or a morpholine ring.

Each of $R^1$ to $R^5$ may independently have the above structure. Particularly, from the viewpoint of color purity, it is preferable that $R^1$ is a hydrogen atom. From the viewpoint of ease of production and availability of raw materials, it is more preferable that all of $R^2$ to $R^5$ are the same.

The divalent aromatic group in $Ar^1$ is not particularly limited. The aromatic group may be a heterocyclic group or an aromatic hydrocarbon group composed of a carbon ring. Examples of the aromatic hydrocarbon in the aromatic hydrocarbon group include: a benzene ring; condensed polycyclic aromatic hydrocarbons such as a naphthalene ring, a tetralin ring, an indene ring, a fluorene ring, an anthracene ring and a phenanthrene ring; and chain polycyclic hydrocarbons such as biphenyl, terphenyl, diphenylmethane, triphenylmethane and stilbene. The chain polycyclic hydrocarbon may have O, S, N in the chain skeleton, such as diphenyl ether. On the other hand, examples of the heterocyclic ring in the heterocyclic group include: five-membered heterocyclic rings such as furan, thiophene, pyrrol, oxazole, thiazole, imidazole and pyrazole; six-membered heterocyclic rings such as pyran, pyrone, pyridine, pyrone, pyridazine, pyrimidine and pyrazine; and condensed polycyclic heterocyclic rings such as benzofuran, thionaphthene, indole, carbazole, coumalin, benzo-pyrone, quinoline, isoquinoline, acridine, phthalazine, quinazoline and quinoxaline. These aromatic groups may have a substituent.

As the substituent that the aromatic group may have, an alkyl group having 1 to 5 carbon atoms and a halogen atom can be exemplified.

$Ar^1$ is preferably an aromatic group having 6 to 20 carbon atoms, more preferably an aromatic group having a condensed polycyclic carbon ring having 10 to 14 carbon atoms. Still more preferred are a phenylene group and a naphthylene group, from the point of view that the structure is simple and the raw materials are low-cost.

$R^1$s per molecule may be the same or different; $R^2$s per molecule may be the same or different; $R^3$s per molecule may be the same or different; $R^4$s per molecule may be the same or different; $R^5$s per molecule may be the same or different; and $Ar^1$s per molecule may be the same or different. The color-forming moieties can exhibit the same color when, in all of the moieties, $R^1$s are the same; $R^2$s are the same; $R^3$s are the same; $R^4$s are the same; $R^5$s are the same; and $Ar^1$s are the same. In this case, therefore, the color material can reproduce the same color as that of a single color-forming moiety, which is preferable from the viewpoint of color purity. On the other hand, if at least one selected from the group consisting of $R^1$s, $R^2$s, $R^3$s, $R^4$s, $R^5$s and $Ar^1$s is changed to a different substituent, it is possible to reproduce a color obtained from a mixture of several kinds of color-forming moieties, so that it is possible to produce a desired color.

In the color material of the present invention, the anionic moiety is a divalent or higher anion having the structure represented by ($B^{c-}$). $B^{c-}$ is not particularly limited as long as it is a divalent or higher anion, and it may be an organic anion or an inorganic anion. Herein, "organic anion" means an anion containing at least one carbon atom. "Inorganic anion" means an anion containing no carbon atom.

In the case that $B^{c-}$ is an organic anion, the structure is not particularly limited. However, it is particularly preferable that $B^{c-}$ is an organic group having an anionic substituent. Examples of the anionic substituent include: imide acid groups such as $-SO_2N^-SO_2CH_3$, $-SO_2N^-COCH_3$, $-SO_2N^-SO_2CF_3$, $-SO_2N^-COCF_3$, $-CF_2SO_2N^-SO_2CH_3$, $-CF_2SO_2N^-COCH_3$, $-CF_2SO_2N^-SO_2CF_3$ and $-CF_2SO_2N^-COCF_3$; and substituents such as $-SO_3^-$, $-CF_2SO_3^-$, $-PO_3^{2-}$, $-COO^-$, $-CF_2PO_3^{2-}$ and $-CF_2COO^-$.

Particularly, from the viewpoint of stabilizing the cation and the coloration of the color material, it is preferable to use two or more monovalent anionic substituents. In addition, from the viewpoint of availability of raw materials and production cost, and also from the point of view that it is highly effective in stabilizing the cation due to their high acidity and thus keeping the state of coloration, preferred are an imide acid group, $-SO_3^-$ and $-CF_2SO_3^-$, and more preferred is $-SO_3^-$ (sulfonato group).

In the case of introducing a plurality of anionic substituents by substitution, the same kind or different kinds of substituents may be used.

The organic group to which the anionic substituent is introduced is not particularly limited. Examples of the organic group include a linear, branched or cyclic saturated or unsaturated hydrocarbon group, monocyclic or polycyclic aromatic group and groups that are combinations thereof. In the carbon chain of these organic groups, hetero atoms such as O, S, N may be contained; a carbonyl group, a carboxyl group, an oxycarbonyl group, an amide group may be contained; and hydrogen atoms may be substituted. As a substituent that the organic group may have, for example, a halogen atom can be exemplified.

Examples of the organic group to which the anionic substituent is introduced include: hydrocarbons such as cyclopropane, cyclobutane, cyclopentane, cyclohexane, norbornane, bicyclo[2,2,2]hexane, bicyclo[3,2,3]octane and adamantine; and aromatic compounds such as benzene, naphthalene, anthracene, phenanthrene, pyrene, triphenylene, fluorene, furan, thiophene, pyrrol, imidazole, pyran, pyridine, pyrimidine, pyrazine, triazine, indole, purine, quinoline, isoquinoline, xanthene and carbazole. Furthermore, the organic group may have a substituent such as a halogen atom or an alkyl group.

Of the above, as the organic group to which the anionic substituent is introduced, preferred are a monocyclic or polycyclic aromatic hydrocarbon group and a group that is a combination thereof, from the point of view that it is easy to introduce the anionic substituent.

In the case of intending not to change color by anions, it is preferable to use an organic group having an absorption maximum in the wavelength range of 400 nm or less. Examples of such an organic group include: organic groups having a condensed polycyclic carbon ring, such as naphthalene, tetralin, indene, fluorene, anthracene and phenanthrene; organic groups having a chain polycyclic hydrocarbon, such as biphenyl, terphenyl, diphenylmethane, triphenylmethane and stilbene; organic groups having a five-membered heterocyclic ring, such as furan, thiophene, pyrrol, oxazole, thiazole, imidazole and pyrazole; aromatic compounds comprising a six-membered heterocyclic ring, such as pyran, pyrone, pyridine, pyridazine, pyrimidine or pyrazine; and organic groups comprising a condensed polycyclic heterocyclic ring, such as benzofuran, thionaphthene, indole, carbazole, coumalin, benzo-pyrone, quinoline, isoquinoline, acridine, phthalazine, quinazoline and quinoxaline.

As the organic group to which the anionic substituent is introduced, there may be used a skeleton derived from an azo dye, an anthraquinone dye, a triphenylmethane dye, a xanthene dye, a phthalocyanine dye or an indigo dye, each of which is an organic compound or an organic metal compound. Alternatively, a dye selected from conventionally-known acid dyes, direct dyes and acid mordant dyes may be used.

In the case of using the dye-derived skeleton, the acid dye, the direct dye or the acid mordant dye, the obtained color tone of the color material changes; therefore, it is possible to adjust the color tone of the color material represented by the general formula (I) to a desired color.

Examples of the acid dyes include: C. I. Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243 and 251; C. I. Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422 and 426; C. I. Acid Orange 6, 7, 8, 10, 12, 26, 50, 51, 52, 56, 62, 63, 64, 74, 75, 94, 95, 107, 108, 169 and 173; C. I. Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335 and 340; C. I. Acid Violet 6B, 7, 9, 17 and 19; and C. I. Acid Green 1, 3, 5, 9, 16, 25, 27, 50, 58, 63, 65, 80, 104, 105, 106 and 109.

Examples of the direct dyes include: C. I. Direct Yellow 2, 33, 34, 35, 38, 39, 43, 47, 50, 54, 58, 68, 69, 70, 71, 86, 93, 94, 95, 98, 102, 108, 109, 129, 136, 138 and 141; C. I. Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246 and 250; C. I. Direct Orange 34, 39, 41, 46, 50, 52, 56, 57, 61, 64, 65, 68, 70, 96, 97, 106 and 107; C. I. Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275 and 293; C. I. Direct Violet 47, 52, 54, 59, 60, 65, 66, 79, 80, 81, 82, 84, 89, 90, 93, 95, 96, 103 and 104; and C. I. Direct Green 25, 27, 31, 32, 34, 37, 63, 65, 66, 67, 68, 69, 72, 77, 79 and 82.

Examples of the acid mordant dyes include: C. I. Mordant Yellow 5, 8, 10, 16, 20, 26, 30, 31, 33, 42, 43, 45, 56, 61, 62 and 65; C. I. Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94 and 95; C. I. Mordant Orange 3, 4, 5, 8, 12, 13, 14, 20, 21, 23, 24, 28, 29, 32, 34, 35, 36, 37, 42, 43, 47 and 48; C. I. Mordant Blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83 and 84; C. I. Mordant Violet 1, 2, 4, 5, 7, 14, 22, 24, 30, 31, 32, 37, 40, 41, 44, 45, 47, 48, 53 and 58; and C. I. Mordant Green 1, 3, 4, 5, 10, 15, 19, 26, 29, 33, 34, 35, 41, 43 and 53.

Of the dyes listed above, in the case of selecting a dye wherein the dye itself is a divalent or higher anion, the dye can be used as it is as the anionic moiety in the color material of the present invention. In the case of selecting a dye wherein the dye itself is not a divalent or higher anion, an anionic substituent is appropriately introduced into the dye so that the dye can be a divalent or higher anion.

From the viewpoint of increasing solvent resistance and electric reliability, the anion ($B^{e-}$) in the general formula (I) is particularly preferably one or more anions selected from the group consisting of those represented by the following general formulae (II), (III) and (IV):

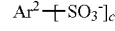

General Formula (II)

wherein $Ar^2$ is a "c"-valent aromatic group which may have a substituent, and "c" is an integer of 2 or more;

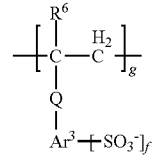

General Formula (III)

wherein R⁶ is a hydrogen atom or a methyl group; Ar³ is an aromatic group which may have a substituent; Q is a direct bond or a divalent linking group; "f" is an integer of 1 or more; and "g" is an integer of 2 or more; and General Formula (IV)

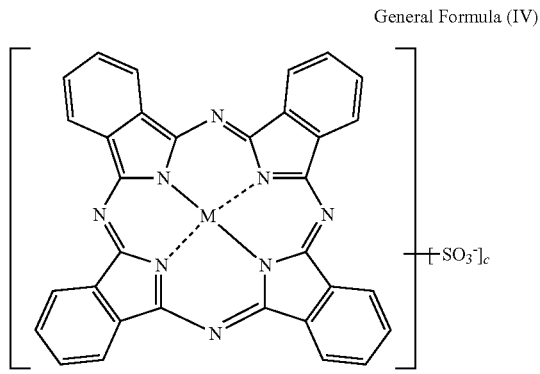

wherein M represents two hydrogen atoms or one selected from the group consisting of Cu, Mg, Al, Ni, Co, Fe and Zn; the sulfonato group (—SO₃⁻ group) is bound to an aromatic ring by substitution; and "c" is an integer of 2 to 4.

In the case of using the anion represented by the above general formula (II) as the anionic moiety of the color material of the present invention, since the color of the anion is colorless or pale yellow, the color material thus produced has a feature that it can keep the inherent color of the cation represented by the general formula (I).

In the case of using the anion represented by the general formula (III) as the anionic moiety of the color material of the present invention, there is an increase in the valence of anion and thus a possible interaction with more cations represented by the general formula (I). As the result, there is an increase in cohesion and insolubility in a solvent.

In the case of using the anion represented by the general formula (IV) as the anionic moiety of the color material of the present invention, the color of the color material can be adjusted to a desired color, depending on the combination with the cationic moiety.

The aromatic group at each of Ar² and Ar³ is not particularly limited. The aromatic group may be an aromatic hydrocarbon group having a carbon ring or a heterocyclic ring. Examples of the aromatic hydrocarbon group include: a benzene ring; condensed polycyclic aromatic hydrocarbon groups such as a naphthalene ring, a tetralin ring, an indene ring, a fluorene ring, an anthracene ring and a phenanthrene ring; and chain polycyclic hydrocarbon groups such as biphenyl, terphenyl, diphenylmethane, triphenylmethane and stilbene. The chain polycyclic hydrocarbon group may have a hetero atom such as O and S in the chain skeleton, such as diphenyl ether, etc. On the other hand, examples of the heterocyclic ring include: five-membered heterocyclic rings such as furan, thiophene, pyrrol, oxazole, thiazole, imidazole and pyrazole; six-membered heterocyclic rings such as pyran, pyrone, pyridine, pyrone, pyridazine, pyrimidine and pyrazine; and condensed polycyclic heterocyclic rings such as benzofuran, thionaphthene, indole, carbazole, coumalin, benzo-pyrone, quinoline, isoquinoline, acridine, phthalazine, quinazoline and quinoxaline. These aromatic groups may have a substituent.

As the substituent of the aromatic group, an alkyl group having 1 to 5 carbon atoms and a halogen atom can be exemplified.

Each of Ar² and Ar³ is preferably an aromatic group having 6 to 20 carbon atoms, more preferably an aromatic group having a condensed polycyclic carbon ring having 10 to 14 carbon atoms. Particularly, from the point of view that the structure is simple and the raw materials are low cost, still more preferred are a phenylene group and a naphthalene group.

In the general formula (III), "Q" is a direct bond or a divalent linking group. Examples of the divalent linking group include an alkylene group having 1 to 10 carbon atoms, an arylene group, a —CONH— group, a —COO— group, an ether group having 1 to 10 carbon atoms (—R'—OR"—: each of R' and R" is independently an alkylene group), and combinations thereof. Of them, "Q" is preferably a direct bond or a —COO— group.

In the general formula (III), "f" is not particularly limited as long as it is an integer of 1 or more. From the viewpoint of availability of raw materials, "f" is preferably 1.

In the general formula (III), "g" is an integer of 2 or more. Particularly, from the viewpoint of heat resistance, "g" is preferably 50 or more, more preferably 80 or more. On the other hand, from the viewpoint of solubility, "g" is preferably 3,000 or less, more preferably 2,000 or less. The weight average molecular weight of the general formula (III) is preferably from 10,000 to 100,000. Herein, the weight average molecular weight means a standard polystyrene-equivalent weight average molecular weight measured by gel permeation chromatography (GPC).

In the general formula (III), the constitutional units may be all the same, or two or more kinds of units may be contained. In the general formula (III), the sum of "f"s equals to "c" in the general formula (I).

On the other hand, in the case that $B^{c-}$ is an inorganic anion, the structure and composition of the inorganic anion is not particularly limited as long as it is an inorganic oxo acid or a dehydration condensation thereof. Examples of the inorganic anion include: divalent or higher anions of an oxo acid, such as a phosphate ion, a sulfate ion, a chromate ion, a tungstate ion ($WO_4^{2-}$) and a molybdate ion ($MoO_4^{2-}$); a polyacid ion obtained by condensation of oxo acids; and mixtures thereof.

The polyacid ion may be an isopolyacid ion $(M_mO_n)^{c-}$ or a heteropolyacid ion $(X_lM_mO_n)^{c-}$. In the above ionic formula, "M" represents a poly atom, "X" represents a hetero atom, "m" represents a composition ratio of the poly atom, and "n" represents a composition ratio of the oxygen atom. Examples of the poly atom "M" include Mo, W, V, Ti and Nb. Examples of the hetero atom "X" include Si, P, As, S, Fe and Co.

Particularly, from the viewpoint of heat resistance, preferred is an anion of an inorganic acid containing molybdenum (Mo) and/or tungsten (W).

Examples of the anion of the inorganic acid containing molybdenum and/or tungsten include: isopolyacids such as a tungstate ion $[W_{10}O_{32}]^{4-}$ and a molybdate ion $[Mo_6O_{19}]^{2-}$; and heteropolyacids such as a phosphotungstate ion $[PW_{12}O_{40}]^{3-}$, a tungstosilicate ion $[SiW_{12}O_{40}]^{4-}$, a phosphomolybdate ion $[PMo_{12}O_{40}]^{3-}$, a phosphotungstomolybdate ion $[PW_{12-x}Mo_xO_{40}]^{3-}$ and $H_3[PW_{2-x}Mo_xO_7]^{4-}$. Of the above, from the viewpoint of heat resistance and availability of raw materials, the anion of the inorganic acid containing molybdenum and/or tungsten is preferably a heteropolyacid, more preferably a heteropolyacid containing P (phosphorus).

In the general formula (I), "a" refers to the number of cationic color-forming moieties constituting the cation. In the general formula (I), "a" is an integer of 2 or more. In the color material of the present invention, the cation is divalent or higher, and the anion is also divalent or higher; therefore, the molecular association described above is formed, resulting in an increase in solvent resistance and electric reliability. On the other hand, the upper limit of "a" is not particularly limited. From the viewpoint of ease of production, "a" is preferably 4 or less, more preferably 3 or less.

In the general formula (I), "b" refers to the number of molecules of cation in the molecular association, and "d" refers to the number of molecules of anion in the molecular association. In the general formula (I), each of "b" and "d" is an integer of 1 or more. In the crystal or aggregate of the color material of the present invention, each of "b" and "d" is not limited to 1 and can be any natural number of 2 or more, such as 2, 3, 4 or so on. From the viewpoint of solvent resistance and electric reliability, it is preferable that at least a part of the color material of the present invention forms a molecular association in which b≥2. In addition, from the viewpoint of solvent resistance and electric reliability, it is preferable that at least a part of the color material of the present invention forms a molecular association in which d≥2.

When "b" is 2 or more, the cations in the molecular association may be of a single kind or a combination of two or more kinds. When "d" is 2 or more, the anions in the molecular association may be a single kind or a combination of two or more kinds, and a combination of an organic anion and an inorganic anion may also be used.

The color material used in the present invention is preferably a normal salt, from the viewpoint of preventing problems such as non-smooth dispersion or liquid dispersion gelation during storage, which are shown in the case of using an acid salt, and also from the viewpoint of high dispersion properties and high dispersion stability.

The average dispersed particle size of the color material used in the present invention is not particularly limited in the color material dispersion liquid, as long as the color layer formed with the color material dispersion liquid shows a desired color. From the viewpoint of higher contrast, excellent solvent resistance and excellent electric reliability, the average dispersed particle size is preferably in the range of 10 to 150 nm, more preferably in the range of 20 to 125 nm. When the average dispersed particle size of the color material is in these ranges, high contrast and high quality are provided to the liquid crystal display device and organic light-emitting display device produced with the color resin composition of the present invention.

The average dispersed particle size of the color material in the color material dispersion liquid is the dispersed particle size of color material particles dispersed in a dispersion medium which comprises at least a solvent, and it is measured with a laser scattering particle size distribution analyzer. For example, the particle size can be obtained by diluting appropriately the color material dispersion liquid with the solvent used in the dispersion liquid to a concentration that is measurable with the laser scattering particle size distribution analyzer (e.g., 1.000-fold) and then measuring the particle size with a laser scattering particle size distribution analyzer (e.g., Nanotrac Particle Size Analyzer UPA-EX150 manufactured by Nikkiso Co., Ltd.) by dynamic light scattering at 23° C. Here, "average dispersed particle size" is volume average particle size.

In the color material dispersion liquid of ht present invention, the content of the color material is not particularly limited. From the viewpoint of dispersibility and dispersion stability, the content of the color material is preferably in the range of 5 to 40% by mass, more preferably in the range of 10 to 20% by mass, relative to the total amount of the color material dispersion liquid.

<Method for Producing the Color Material Represented by the General Formula (I)>

The method for producing the color material represented by the general formula (I) is not particularly limited. For example, the color material can be obtained by producing a cationic moiety in the following manner and then introducing a counter anion.

(Synthesis of an Intermediate Represented by the Following General Formula (A))

First, the intermediate represented by the following general formula (A), which is a precursor compound of the cationic moiety, is synthesized:

General Formula (A)

wherein A, $R^1$ and "a" are the same as those in the general formula (I) and $Ar^{1'}$ is a structure in which a hydrogen is bound to $Ar^1$ of the general formula (I).

The method for synthesizing the compound represented by the general formula (A) is not particularly limited. For example, the compound can be obtained by reacting in a solvent a halogenated aromatic compound having a desired substituent $Ar^{1'}$ introduced therein, with an "a"-valent amine compound having a desired substituent A introduced therein, in the presence of a base and a catalyst such as palladium acetate.

The amount of the halogenated aromatic compound used in the above reaction varies, depending on a desired valence (a). For example, if "a" is desired to be 2, the amount of the halogenated aromatic compound is preferably 1.5 to 10 molar equivalent, more preferably 1.5 to 3.0 molar equivalent, still more preferably 1.8 to 2.2 molar equivalent, with respect to the amine compound, from the viewpoint of inhibiting generation of by-products and improving the reaction yield.

In the above reaction, the reaction temperature is not particularly limited and is generally around 100 to 150° C. It is preferably 130 to 145° C. from the viewpoint of inhibiting side reactions. Also in the above reaction, the reaction pressure is not particularly limited. It is preferably from an ordinary pressure to 0.1 MPa, more preferably an ordinary pressure. In the above reaction, the reaction time varies depending on the synthesis amount and the reaction temperature. It is generally set in the range of 6 to 72 hours, preferably 6 to 48 hours.

The base used in the reaction is not particularly limited. The examples include sodium hydroxide, potassium hydrate, potassium carbonate, metal alkoxides and metal amides. Particularly, it is preferable to use a strong base with low nucleophilicity, from the viewpoint of inhibiting side reactions and improving the yield of the base generator. The examples include potassium t-butoxide, sodium t-butoxide, lithium t-butoxide, lithium diisopropylamide, potassium hexamethyldisilazide and lithium tetramethylpiperidide. Of them, potassium t-butoxide is more preferable for use.

The amount of the base added is not particularly limited. With respect to the amine compound, it is generally 2.0 to 4.0 molar equivalent. From the viewpoint of improving the reaction yield, it is preferably 2.5 to 3.5 molar equivalent.

(Synthesis of the Cationic Moiety)

The cationic moiety of the color material represented by the general formula (I) can be obtained in the form of a chloride by reacting the intermediate represented by the general formula (A) and a compound represented by the following general formula (B) in a solvent, using a chlorinating agent such as phosphorus oxychloride:

General Formula (B)

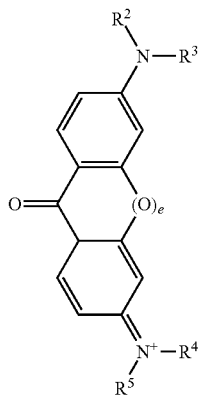

wherein $R^2$ to $R^5$ and "e" are the same as those in the general formula (I).

The amount of the compound represented by the general formula (B) and used in the above reaction varies depending on a desired valence (a). For example, if "a" is desired to be 2, the amount of the compound represented by the general formula (B) is preferably 1.5 to 4.0 molar equivalent, more preferably 1.5 to 3.0 molar equivalent, still more preferably 1.8 to 2.2 molar equivalent, with respect to the compound represented by the general formula (A), from the viewpoint of inhibiting generation of by-products and improving the reaction yield.

The reaction temperature in the above reaction is not particularly limited and is generally around 110 to 150° C. It is preferably 110 to 120° C., from the viewpoint of inhibiting side reactions. The reaction pressure in the above reaction is not particularly limited. It is preferably from an ordinary pressure to 0.1 MPa, more preferably an ordinary pressure. The reaction time in the above reaction varies depending on the amount of synthesis and the reaction temperature. It is generally set in the range of 1 to 10 hours, preferably 1 to 5 hours.

The amount of the phosphorous oxychloride added is not particularly limited. With respect to the compound represented by the general formula (A), it is generally 1.5 to 3.0 molar equivalent. From the viewpoint of improving the reaction yield, it is preferably 1.8 to 3.0 molar equivalent.

The color material represented by the general formula (I) can be obtained by mixing the chloride of the cationic moiety obtained by the above reaction and a desired anionic moiety in a solvent.

(Dispersant)

In the color material dispersion liquid of the present invention, the color material represented by the general formula (I) is dispersed in a solvent for use. In the present invention, a dispersant is used to disperse the color material well. The dispersant can be selected from those that are conventionally used as pigment dispersants. As the dispersant, for example, there may be used surfactants such as cationic, anionic, nonionic, amphoteric, silicone-based and fluorine-based dispersing agents. Among surfactants, polymer surfactants (polymer dispersants) are preferred from the viewpoint of homogeneous, fine dispersion.

Examples of polymer dispersants include (co)polymers of unsaturated carboxylic esters such as polyacrylic ester; (partial) amine salts, (partial) ammonium salts or (partial) alkylamine salts of (co)polymers of unsaturated carboxylic acids, such as polyacrylic acid; (co)polymers of hydroxyl group-containing unsaturated carboxylic esters, such as hydroxyl group-containing polyacrylic ester, and modified products thereof; polyurethanes; unsaturated polyamides; polysiloxanes; long-chain polyaminoamide phosphates; polyethyleneimine derivatives (amides obtained by reaction of poly(lower alkyleneimines) and free carboxyl group-containing polyesters, and bases thereof); and polyallylamine derivatives (reaction products obtained by reaction of polyallylamine with one or more compounds selected from the group consisting of the following three compounds: a free carboxyl group-containing polyester, a free carboxyl group-containing polyamide and a free carboxyl group-containing co-condensate of ester and amide (polyesteramide).

Particularly preferred polymer dispersants are polymer dispersants in which a nitrogen atom is contained in a main or side chain thereof, from the point of view that such dispersants can suitably disperse the color material represented by the general formula (I) and has excellent dispersion stability. In the case of using such a dispersant, it is estimated that the dispersant has a role in not only dispersing the color material represented by the general formula (I) well but also making the color material present stably in the state of ion pair or in the state of the above-described molecular association. As a result, the color material dispersion liquid with excellent solvent stability and electric reliability, is obtained.

Examples of polymer dispersants in which a nitrogen atom is contained in a main or side chain thereof, include (partial) amine salts, (partial) ammonium salts or (partial) alkylamine salts of (co)polymers of unsaturated carboxylic acids, such as polyacrylic acid; polyurethanes; unsaturated polyamides; polyethyleneimine derivatives; and polyallylamine derivatives.

More specifically, there may be mentioned the following dispersants, for example.

As the (partial) amine salts, (partial) ammonium salts or (partial) alkylamine salts of (co)polymers of unsaturated carboxylic acids, such as polyacrylic acid, there may be used Disperbyk 2000 and 2001 (these and the following Disperbyk series products are all manufactured by BYK Japan KK), for example.

As the polyurethanes, there may be mentioned Disperbyk 161, for example.

As the unsaturated polyamides, there may be mentioned Disperbyk 101 and 130, for example.

As the polyallylamine derivatives, there may be mentioned commercially-available polyallylamine derivative products such as AJISPER PB821, PB822, PB824 and PB827 (manufactured by Ajinomoto Fine-Techno. Co., Inc.), for example.

As the polyethyleneimine derivatives, there may be mentioned commercially-available polyethyleneimine derivative products such as Solsperse 33500 (manufactured by The Lubrizol Corporation), for example.

Other commercially-available dispersants include, for example, Disperbyk 116, 140, 160, 162, 163, 164, 166, 167, 168, 170, 171, 174, 182 and 2050 (manufactured by BYK Japan KK); EFKA 4046 and 4047 (manufactured by EFKA CHEMICALS); Solsperse 12000, 13250, 13940, 17000, 20000, 24000GR, 24000SC, 27000, 28000, 32000, 33500, 35200, 37500 (manufactured by The Lubrizol Corporation); and AJISPER PB711, 823, 880 (manufactured by Ajinomoto Fine-Techno. Co., Inc.)

From the viewpoint of excellent solvent resistance and electric reliability and increasing contrast, particularly preferred as the polymer dispersant in which a nitrogen atom is contained in a main or side chain thereof are those containing polyallylamine derivatives. Of polyallylamine derivatives, preferred is a graft copolymer which has an allylamine derivative in the main chain and in which the sum of tertiary amino groups and quaternary ammonium salts is 20% by mole or less relative to all amino groups in the graft copolymer. More preferred is a graft copolymer which has an allylamine derivative in the main chain and in which the sum of tertiary amino groups and quaternary ammonium salts is 10% by mole or less relative to all amino groups in the graft copolymer. Particularly preferred is a graft copolymer which has an allylamine derivative in the main chain and which contains no tertiary amino groups and quaternary ammonium salts.

When the allylamine polymer is such a graft copolymer, there is an increase in the adhesion properties of the nitrogen site of the main chain skeleton to the color material represented by the general formula (I), so that the color material can be present more stably in the state of ion pair or in the state of the above-described molecular association. It is estimated that as a result, there is a further increase in solvent resistance and electric reliability. On the other hand, since the grafted polymer chains is soluble in the solvent, the color material can be stabilized in the solvent and it is estimated that, as a result, there is an increase in the dispersibility and dispersion stability of the color material and thus an increase in contrast.

A polyallylamine derivative is a polymer which has at least a repeating unit derived from allylamine. In the present invention, the polyallylamine derivative may be a polymer derived from only one kind of monomer, which is allylamine, or may be a copolymer derived from two or more kinds of other polymerizable monomers.

Examples of other polymerizable allylamine monomers include allylamine derivatives such as alkyl allyl amine, diallylamine and derivatives thereof, and allylamine and salts of derivatives thereof. Concrete examples thereof include allylamine hydrochloride, allylamine acetate, allylamine sulfate, diallylamine, diallylamine hydrochloride, diallylamine acetate, diallylamine sulfate, diallylmethylamine and salts thereof (such as hydrochloride, acetate and sulfate), diallylethylamine and salts thereof (such as hydrochloride, acetate and sulfate), diallyldimethylammonium salts (counter anions of the salts include chloride, acetate ion and sulfate ion), dimethylallylamine, diethylallylamine and salts thereof. These allylamine and diallylamine derivatives have poor polymerization properties when they are in the form of amine, so that they are generally polymerized in the form of salt and desalted as needed.

Also, the polyallylamine derivative may further have a repeating unit derived from a monomer other than allylamine monomers. Examples of such a monomer include (meth)acrylic acid ester monomers such as methyl (meth)acrylate, ethyl (meth)acrylate, 2-methoxyethyl (meth)acrylate, 2-ethoxyethyl (meth)acrylate, propyl (meth)acrylate, isopropyl (meth)acrylate, n-butyl (meth)acrylate, tert-butyl (meth)acrylate, isobutyl (meth)acrylate, pentyl (meth)acrylate, isopentyl (meth)acrylate, isobornyl (meth)acrylate, hexyl (meth)acrylate, 2-ethylhexyl (meth)acrylate, octyl (meth)acrylate, cyclohexyl (meth)acrylate, dicyclopentanyl (meth) acrylate, 2-phenoxyethyl (meth)acrylate, allyl (meth)acrylate, benzil (meth)acrylate, glycidyl (meth)acrylate and vinyl (meth)acrylate; and vinyl monomers such as ethyl vinyl ether, butyl vinyl ether, isobutyl vinyl ether, 2-ethylhexyl vinyl ether, cyclohexyl vinyl ether, vinyl acetate, 4-vinylbiphenyl, vinyl butyrate, vinylcyclohexene, vinylcyclopentane, vinyl hexanoate, vinyl 2-ethylhexanoate and vinyl toluene.

When two or more kinds of monomers form a copolymer, the configuration is not particularly limited and may be a random copolymer, a block copolymer, etc.

From the viewpoint of solvent resistance and electric reliability, the ratio of the components in the polyallylamine derivative is preferably such that monomers other than allylamine monomers are 1 molar equivalent or less relative to allylamine monomers of 1 molar equivalent. More preferably, monomers other than allylamine monomers are 0.5 molar equivalent or less. It is still more preferable that monomers other than allylamine monomers are not substantially contained in the polyallylamine derivative.

Of dispersants having a polyallylamine derivative, the dispersant is preferably a graft copolymer which is obtained by reaction of an allylamine polymer having an amino group in a side chain thereof with a free carboxylic acid-containing polyester, polyamide and/or polyester amide, from the point of view that there is an increase in the dispersibility and dispersion stability of the color material and the color material is excellent in solvent resistance and electric reliability.

It is particularly preferable that the dispersant has a repeating unit represented by the following general formula (i), form the viewpoint of achieving higher contrast and having excellent solvent resistance and electric reliability:

wherein $R^{11}$ is a free amino group or a group represented by the following general formula (ii) or (iii); "n" is the number of repeating units; when there is "n" $R^{11}$ or there are "n" $R^{11}$s, at least one $R^{11}$ is a group represented by the general formula (iii):

wherein $R^{12}$ is a residue obtained after removal of a carboxyl group from any one of the polyester containing a free carboxylic acid, the polyamide containing a free carboxylic acid, and the polyester amide containing a free carboxylic acid.

The polyallylamine derivative represented by the general formula (i) is obtained by reaction of, for example, an allylamine polymer with one or more compounds selected from the group consisting of the following three compounds: a free carboxyl group-containing polyester, a free carboxyl group-containing polyamide and a free carboxyl group-containing co-condensate of ester and amide (polyesteramide).

More specifically, the polyallylamine derivative represented by the general formula (i) can be obtained by using an allylamine polymer and at least one selected from the group consisting a free carboxyl group-containing polyester represented by the following general formula (iv) or (v) and a free carboxyl group-containing polyamide represented by the following general formula (vi) or (vii) and then reacting the amino group with the carboxyl group:

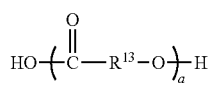

wherein $R^{13}$ is a linear or branched alkylene group having 2 to 20 carbon atoms, and "a" is an integer of 2 to 100;

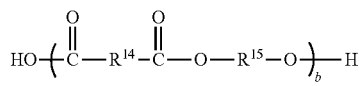

wherein $R^{14}$ is one selected from the group consisting of a linear or branched alkylene group having 2 to 20 carbon atoms, $C_6H_4$ and $CH=CH$; $R^{15}$ is a residue obtained by removal of two hydroxyl groups from a linear or branched alkylene group having 2 to 20 carbon atoms or from polyalkylene glycol; "b" is an integer of 2 to 100; and an ether bond may be contained in the chain;

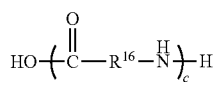

wherein $R^{16}$ is a linear or branched alkylene group having 2 to 20 carbon atoms, and "c" is an integer of 2 to 100; and

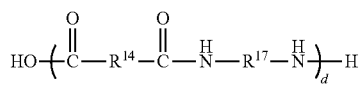

wherein $R^{14}$ is one selected from the group consisting of a linear or branched alkylene group having 2 to 20 carbon atoms, $C_6H_4$ and $CH=CH$; $R^{17}$ is a linear or branched alkylene group having 2 to 20 carbon atoms; and "d" is an integer of 2 to 100.

The preferred polyallylamine derivatives described above can be also obtained by reaction of an allylamine polymer with one selected from the group consisting of the polyester in which the repeating components of the general formulae (iv) and (v) have been randomly polymerized; the polyamide in which the repeating components of the general formulae (vi) and (vii) have been randomly polymerized; and the polyester amide in which the repeating components of the general formula (iv) and/or (v) and the repeating components of the general formula (vi) and/or (vii) have been randomly polymerized.

The polyallylamine derivative preferably contains the repeating units represented by the general formula (i) as the allylamine polymer (main chain) so that the total number "n" of the repeating units is 2 to 2,500, more preferably 2 to 1,000, still more preferably 2 to 300. More specifically, as the allylamine polymer (main chain), it is preferable to use a polyallylamine having a polymerization degree of 2 to 2,500, which is an allylamine homopolymer, more preferably a polyallylamine having a polymerization degree of 2 to 1,000, still more preferably a polyallylamine having a polymerization degree of 2 to 300.

In the present invention, preferred is a polyallylamine derivative obtained by reaction of a polyallylamine having a polymerization degree of 2 to 1,000 with one or more selected from the group consisting of the free carboxyl group-containing polyester represented by the general formula (iv) or (v) and the free carboxyl group-containing polyamide represented by the general formula (vi) or (vii).

The polyallylamine derivative used in the present invention is particularly preferably such that $R''$ is a residue obtained after removal of the carboxyl group from the free carboxylic acid-containing polyester. It is also preferable that the polyester has a number average molecular weight in the range of 500 to 20,000.

In the general formula (i), of "n" $R^{11}$s, the percentage of the groups represented by the general formula (iii) is preferably 60 to 95%.

As such a polyallylamine derivative, the above-listed, commercially-available polyallylamine derivative products can be used.

In the color material dispersion liquid of the present invention, the content of the dispersant is not particularly limited as long as the effects of the present invention are not undermined. However, from the viewpoint of the dispersibility and dispersion stability over time of the color material, the content of the dispersant is preferably 5 to 100 parts by mass, more preferably 10 to 80 parts by mass, relative to 100 parts by mass of the color material.

(Solvent)

The solvent used in the present invention is a solvent in which the color material represented by the general formula (I) is substantially insoluble or hardly soluble, and is also a solvent having a solubility of the color material of 0.1 (mg/10 g solvent) or less at 23° C. By using such a solvent in the color material dispersion liquid of the present invention, the color material can be dispersed and used in the form of particles (aggregates) in the solvent. In the present invention, the color material dispersion liquid has excellent solvent resistance and electric reliability because the color material represented by the general formula (I) is dispersed in the solvent, with keeping its aggregation state, and used. The solvent is preferably one having a solubility of the color material of 0.1 (mg/10 g solvent) or less at 23° C., more preferably one in which the color material is substantially insoluble.

In the present invention, the solvent having a solubility of the color material represented by the general formula (I) of 0.1 (mg/10 g solvent) or less at 23° C., can be simply determined by the following evaluation method.

First, 10 g of a solvent to be evaluated and then 0.1 g of the color material are put in a 20 mL sample tube. The tube is covered with a lid, shaken well for 20 seconds, and then left in a water bath at 23° C. for 10 minutes. Then, 5 g of the supernatant is filtered to remove insoluble substances. The thus-obtained filtrate is diluted by 1,000 times. Then, the diluted solution is measured for absorption spectrum, using a 1 cm cell in an ultraviolet and visible spectrophotometer (product name: UV-2500PC; manufactured by: Shimadzu Corporation) to calculate the absorbance at the maximum absorption wavelength. At this time, if the absorbance at the maximum absorption wavelength is less than 2, it can be evaluated that the solvent is a solvent having a solubility of the color material represented by the general formula (I) of 0.1 (mg/10 g solvent) or less at 23° C. (that is, a hardly-soluble solvent).

Also in the above evaluation method, the absorption spectrum is measured in the same manner as described above, without diluting the obtained filtrate, to calculate the absorbance at the maximum absorption wavelength. At this time, if the absorbance at the maximum absorption wavelength is less than 2, it can be evaluated that the solvent is a solvent which does not substantially dissolve the color material represented by the general formula (I).

The solvent having a solubility of the color material of 0.1 (mg/10 g solvent) or less at 23° C. is not particularly limited as long as it is a solvent which does not substantially dissolve the color material represented by the general formula (I) or is a hardly-soluble solvent. The solvent can be appropriately selected for use from solvents which are not reactive with the components in the color material dispersion liquid and which can dissolve or disperse them.

In the color material dispersion liquid of the present invention, it is preferable to use an ester solvent, from the viewpoint of dispersion stability.

Examples of ester solvents include ethyl acetate, butyl acetate, methyl methoxypropionate, ethyl ethoxypropionate, ethyl lactate, methoxyethyl acetate, propylene glycol monomethyl ether acetate, 3-methoxy-3-methyl-1-butyl acetate, 3-methoxybutyl acetate, methoxybutyl acetate, ethoxyethyl acetate and ethyl cellosolve acetate.

These solvents may be used alone or in combination of two or more kinds.

The color material dispersion liquid of the present invention is prepared by using the above-described solvent generally at a ratio of 60 to 85% by mass relative to the total amount of the color material dispersion liquid containing the solvent. The smaller the solvent amount, the higher the viscosity and the lower the dispersibility. The larger the solvent amount, the lower the color material concentration, possibly resulting in a difficulty in achieving a target chromaticity coordinate after preparation of the resin composition (Other Components)

The color material dispersion liquid of the present invention may further comprise a pigment, a dye, a dispersion assisting resin and other components, as needed.

The pigment and dye are added to control color tone, as needed. They can be selected from conventionally-known pigments and dyes, according to the purpose, and such pigments can be used alone or in combination of two or more kinds, as well as dyes. The content of the pigment and dye are not particularly limited as long as the effects of the present invention are not undermined. The amounts may be the same as the color resin composition for color filters, which will be described below.

As the dispersion assisting resin, there may be mentioned an alkali-soluble resin for example, which will be mentioned below under "Color resin composition color filters". The particles of the color material becomes less likely to contact with each other due to steric hindrance by the alkali soluble resin, resulting in stabilization or particle dispersion, and the particle dispersion stabilization effect may be effective in reducing the dispersant.

Other components include a surfactant, which is used to increase wettability, a silane coupling agent, which is used to increase adhesion properties, a defoaming agent, a cissing inhibitor, an antioxidant, an aggregation inhibitor and an ultraviolet absorber, for example.

<Method for Producing the Color Material Dispersion Liquid>

The color material dispersion liquid of the present invention is prepared as follows: the dispersant is mixed with the solvent and agitated to prepare a dispersant solution; the dispersant solution is mixed with the color material and, as needed, other compounds; and the mixture is dispersed with a disperser, thereby obtaining the color material dispersion liquid. The color material dispersion liquid of the present invention can be also prepared by mixing the color material and the dispersant with the solvent and dispersing the mixture with a known disperser.

As the disperser for dispersion treatment, there may be mentioned roll mills such as a two-roll mill and a three-roll mill, ball mills such as a vibrating ball mill, paint conditioners, bead mills such as a continuous disk type bead mill and a continuous annular type bead mill, for example. In the case of using a bead mill, a preferred dispersion condition is that the diameter of beads is 0.03 to 2.00 mm, more preferably 0.10 to 1.0 mm.

In particular, a preliminary dispersion is performed with 2 mm zirconia beads, which is a relatively large bead diameter, and then a main dispersion is further performed with 0.1 mm zirconia beads, which is a relatively small bead diameter. It is preferable to perform filtration with a 0.1 to 0.5 μm membrane filter after the dispersion treatment.

In the present invention, the dispersion time for dispersion with a known disperser is appropriately controlled and is not particularly limited. However, the dispersion time is preferably 5 to 40 hours, from the viewpoint of making the color material represented by the general formula (I) finer and minuter and thus obtaining a high transmittance.

The color material dispersion liquid is obtained in the manner described above, in which the color material particles have excellent dispersibility. The color material dispersion liquid is used as a pre-prepared product for preparing the color resin composition for color filters, which has excellent dispersibility.

[Color Resin Composition for Color Filters]

The color resin composition for color filters according to the present invention comprises the color material dispersion liquid of the present invention, a binder component and a solvent.

According to the present invention, because of containing the color material dispersion liquid of the present invention, the color resin composition thus provided can achieve higher contrast, with achieving higher luminance as that of dyes, and has high uniformity; therefore, a color layer with excellent solvent resistance and electric reliability can be formed.

Also, excellent developing properties can be obtained when the color resin composition for color filters of the present invention is made into the below-described photosensitive resin composition. A cation dye is generally subjected a decrease in solubility in alkaline aqueous solutions upon development, by an electrostatic interaction between acrylic acid groups in the below-described alkali soluble resin and cations of the dye. Especially when a cation dye is uniformly dissolved in a resin composition, the resin composition is very affected by the interaction and shows poor solubility in developing solutions. In the color resin composition for color filters of the present invention, however, since the color material represented by the general formula (I) is dispersed by the dispersant, the fine particles of the color material are covered with the dispersant and its steric hindrance prevents the electrostatic interaction between the color material fine particles and the acrylic acid groups of the alkali soluble resin; therefore, the color resin composition for color filters of the present invention is estimated to have sufficient solubility in developing solutions.

The color resin composition of the present invention comprises at least the above-mentioned color material dispersion liquid, a binder component and a solvent, and it may comprise other compounds as needed.

Hereinafter, the components of the color resin composition will be described in detail.

In the color resin composition for color filters of the present invention, the components which can be contained in the color material dispersion liquid of the present invention can be the same components as those that have been described above under "Color material dispersion liquid", so that the components will not be described below.

(Solvent)

The solvent used in the color resin composition for color filters of the present invention is not particularly limited as long as the effects of the present invention are not undermined. Especially from the viewpoint of excellent dispersibility of the color material particles, the solvent is preferably a solvent having a solubility of the color material of 0.1 (mg/10 g solvent) or less at 23° C., more preferably a solvent having a solubility of the color material of 0.01 (mg/10 g solvent) or less at 23° C., still more preferably one in which the color material is substantially insoluble. The solvent preferably used in the color resin composition for color filters may be the same as the solvent used in the color material dispersion liquid.

(Binder Component)

To provide film-forming and surface adhesion properties and to provide sufficient hardness to coating films, it is preferable that a curable binder component is contained in the color resin composition for color filters of the present invention. The curable binder component is not particularly limited, and conventionally-known curable binder components that are used to form color layers of color filters can be appropriately used.

The curable binder component includes a photocurable binder component containing a photocurable resin, the resin being polymerizable and curable by visible light, ultraviolet or electron beam radiation, etc., and a thermosetting binder component containing a thermosetting resin, the resin being polymerizable and curable by heating.

No developing properties are required of the curable binder component when it is possible to form color layers by attaching the color resin composition of the present invention selectively in a pattern onto a substrate, such as the ink-jet method. In this case, there may be used a known thermosetting binder component or photocurable binder component, appropriately, which are used to form color layers of color filters by the ink-jet method, etc.

On the other hand, in the case of using a photolithography process to form color filters, a photosensitive binder component with alkali developing properties is suitably used.

Hereinafter, the photosensitive binder component and the thermosetting binder component which is suitable for use in the ink jet method, will be explained in detail. However, the curable binder component used in the present invention is not limited to them.

(1) Photosensitive Binder Component

Photosensitive binder components include a positive photosensitive binder component and a negative photosensitive binder component. Examples of positive photosensitive binder components include those comprising an alkali soluble resin and an o-quinonediazide group-containing compound, which is a photosensitivity-imparting component. Examples of alkali soluble resins include polyimide precursors.

As the negative photosensitive binder component, those comprising at least an alkali soluble resin, a polyfunctional monomer and a photoinitiator, are suitably used. Hereinafter, the alkali soluble resin, the polyfunctional monomer and the photoinitiator will be explained in detail.

<Alkali Soluble Resin>

The alkali soluble resin in the present invention is one having a carboxyl group in a side chain thereof. It functions as a binder resin and can be appropriately selected and used as long as it is soluble in developing solutions used for pattern formation, particularly preferably alkali developing solutions.

The alkali soluble resin preferred in the present invention is a resin having a carboxyl group. Concrete examples thereof include acrylic copolymers having a carboxyl group and epoxy (meth)acrylate resins having a carboxyl group. Of these, particularly preferred is one having a carboxyl group and, moreover, a photopolymerizable functional group such as an ethylenically unsaturated group in a side chain thereof. This is because there is an increase in the hardness of the cured film thus formed, by containing the photopolymerizable functional group. These acrylic copolymers and epoxy (meth)acrylate resins can be used in combination of two or more kinds.

An acrylic copolymer having a carboxyl group is obtained by copolymerizing a carboxyl group-containing ethylenically unsaturated monomer and an ethylenically unsaturated monomer.

The acrylic copolymer having a carboxyl group may further comprise a constitutional unit having an aromatic carbon ring. The aromatic carbon ring functions as a component which imparts coatability to the color resin composition for color filters.

The acrylic copolymer having a carboxyl group may further comprise a constitutional unit having an ester group. The constitutional unit having an ester group not only functions as a component which inhibits alkali solubility of the color resin composition for color filters, but also functions as a component which increases solubility in solvents and re-solubility in solvents.

Examples of the acrylic copolymer having a carboxyl group include copolymers obtained from one or more kinds selected from the group consisting of: methyl (meth)acrylate, ethyl (meth)acrylate, n-propyl (meth)acrylate, isopropyl (meth)acrylate, n-butyl (meth)acrylate, sec-butyl (meth)acrylate, isobutyl (meth)acrylate, tert-butyl (meth)acrylate, n-hexyl (meth)acrylate, 2-ethylhexyl (meth)acrylate, n-octyl (meth)acrylate, benzyl (meth)acrylate, phenyl (meth)acrylate, phenoxyethyl (meth)acrylate, cyclohexyl (meth)acrylate, isobornyl (meth)acrylate, dicyclopentanyl (meth)acrylate, 1-adamantyl (meth)acrylate, allyl (meth)acrylate, 2,2'-oxybis(methylene)bis-2-propenoate, styrene, γ-methylstyrene, glycidyl (meth)acrylate, 2-hydroxyethyl (meth)acrylate, 2-dimethylaminoethyl (meth)acrylate, N-vinyl-2-pyrrolidone, N-methylmaleimide, N-cyclohexylmaleimide, N-benzylmaleimide and N-phenylmaleimide; with one or more anhydrides selected from the group consisting of: (meth)acrylic acid, 2-(meth)acryloyloxyethyl succinic acid, 2-(meth)acryloyloxyethyl phthalic acid, acrylic acid dimer (e.g., M-5600 manufactured by TOAGOSEI Co., Ltd.), itaconic acid, crotonic acid, maleic acid, fumaric acid and vinyl acetic acid. Also, there may be mentioned polymers obtained by introducing an ethylenically unsaturated bond in the above copolymers by, for example, addition of an ethylenically unsaturated compound having a reactive functional group such as a glycidyl group or hydroxyl group. In the present invention, however, the acrylic copolymer having a carboxyl group is not limited to these examples.

Of these examples, the polymers obtained by introducing an ethylenically unsaturated bond in the above copolymers by, for example, addition of an ethylenically unsaturated compound having a glycidyl group or hydroxyl group, are particularly preferred from the point of view that polymerization with the below-described polyfunctional monomer is possible upon exposure and stable color filters can be obtained.

The copolymerization ratio of the carboxyl group-containing ethylenically unsaturated monomer in the carboxyl group-containing copolymer is generally 5 to 50% by mass, preferably 10 to 40% by mass. When the copolymerization ratio of the carboxyl group-containing ethylenically unsaturated monomer is less than 5% by mass, there is a decrease in the solubility of the coating film thus obtained in alkali developing solutions, resulting in a difficulty with pattern formation. When the copolymerization ratio exceeds 50% by mass, upon development with an alkali developing solution, a pattern thus formed is likely to come off of the substrate or roughening of pattern surface is likely to occur.

The molecular weight of the carboxyl group-containing copolymer is preferably in the range of 1,000 to 500,000, more preferably in the range of 3,000 to 200,000. When the molecular weight is less than 1,000, there may be a remarkable decrease in binder function after curing. When the molecular weight exceeds 500,000, upon development with an alkali developing solution, pattern formation may be difficult.

The epoxy (meth)acrylate resin having a carboxyl group is not particularly limited. As the resin, however, an epoxy (meth)acrylate compound obtained by reaction of an acid anhydride with a reaction product of an epoxy compound and an unsaturated group-containing monocarboxylic acid, is suitable.

The epoxy compound is not particularly limited. Examples thereof include epoxy compounds such as bisphenol A type epoxy compounds, bisphenol F type epoxy compounds, bisphenol S type epoxy compounds, phenol novolac type epoxy compounds, cresol novolac type epoxy compounds, aliphatic epoxy compounds and bisphenol fluorene type epoxy compounds. They may be used alone or in combination of two or more kinds.

As the unsaturated group-containing monocarboxylic acid, for example, there may be mentioned (meth)acrylic acid, 2-(meth)acryloyloxyethyl succinic acid, 2-(meth)acryloyloxyethyl phthalic acid, (meth)acryloyloxyethyl hexahydrophtalic acid, (meth)acrylic acid dimer, β-furfuryl acrylic acid, β-styryl acrylic acid, cinnamic acid and α-cyano cinnamic acid. These unsaturated group-containing monocarboxylic acids can be used alone or in combination of two or more kinds.

As the acid anhydride, there may be mentioned the following: dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endomethylene tetrahydrophthalic anhydride, methylendomethylene tetrahydrophthalic anhydride, chlorendic anhydride, methyltetrahydrophthalic anhydride; aromatic polycarboxylic acid anhydrides such as trimellitic anhydride, pyromellitic dianhydride, benzophenonetetracarboxylic dianhydride, biphenyltetracarboxylic dianhydride, biphenyl ether tetracarboxylic acid; and polycarboxylic acid anhydride derivatives such as 5-(2,5-dioxotetrahydrofuryl)-3-methyl-3-cyclohexen-1,2-dicarboxylic anhydride and endobicyclo-[2,2,1]-hepto-5-ene-2,3-dicarboxylic anhydride. They may be used alone or in combination of two or more kinds.

The molecular weight of the carboxyl group-containing epoxy (meth)acrylate compound obtained as above, is not particularly limited. However, it is preferably 1,000 to 40,000 more preferably 2,000 to 5,000.

The alkali soluble resin used in the color resin composition for color filters of the present invention, may be used one alkali soluble resin or a combination of two or more alkali soluble resins. The content of the alkali soluble resin is generally in the range of 10 to 1,000 parts by mass, preferably in the range of 20 to 500 parts by mass, relative to 100 parts by mass of the color material contained in the color resin composition for color filters. When the content of the alkali soluble resin is too small, sufficient alkali developing properties may be obtained. When the content is too large, the ratio of the color material is relatively small, so that sufficient color concentration may not be obtained.

<Polyfunctional Monomer>

The polyfunctional monomer used in the color resin composition for color filters of the present invention, is not particularly limited as long as it is polymerizable with the below-described photoinitiator. As the polyfunctional monomer, a compound having two or more ethylenically unsaturated double bonds is generally used. Preferably, the polyfunctional monomer is a polyfunctional (meth)acrylate having two or more acryloyl or methacryloyl groups.

Example of such a polyfunctional (meth)acrylate include difunctional (meth)acrylates such as ethylene glycol di(meth)acrylate, diethylene glycol di(meth)acrylate, hexanediol di(meth)acrylate, long chain aliphatic di(meth)acrylate, neopentyl glycol di(meth)acrylate, hydroxypivalic acid neopentylglycol di(meth)acrylate, stearic acid-modified pentaerythritol di(meth)acrylate, propylene glycol di(meth)acrylate, glycerol di(meth)acrylate, triethylene glycol di(meth)acrylate, tetraethylene glycol di(meth)acrylate, butylene glycol di(meth)acrylate, dicyclopentanyl di(meth)acrylate, polyethylene glycol di(meth)acrylate, polypropylene di(meth)acrylate, triglycerol di(meth)acrylate, neopentyl glycol-modified trimethylolpropane di(meth)acrylate, allylcyclohexyl di(meth)acrylate, methoxycyclohexyl di(meth)acrylate, acrylated isocyanurate, bis(acryloxy neopentyl glycol)adipate, bisphenol A di(meth)acrylate, tetrabromo bisphenol A di(meth)acrylate, bisphenol S di(meth)acrylate, butanediol di(meth)acrylate, phthalic di(meth)acrylate, phosphate di(meth)acrylate, zinc di(meth)acrylate.

Examples of trifunctional polyfunctional (meth)acrylates include trimethylolpropane tri(meth)acrylate, trimethylolethane tri(meth)acrylate, glycerol tri(meth)acrylate, pentaerythritol tri(meth)acrylate, pentaerythritol tetra(meth)acrylate, alkyl-modified dipentaerythritol tri(meth)acrylate, succinic anhydride-modified pentaerythritol tetra(meth)acrylate, phosphate tri(meth)acrylate, tris(acryloxyethyl)isocyanurate, tris(methacryloxyethyl)isocyanurate, dipentaerythritol tetra(meth)acrylate, ditrimethylolpropane tetraacrylate, alkyl-modified dipentaerythritol tetra(meth)acrylate, dipentaerythritol hexa(meth)acrylate, dipentaerythritol penta(meth)acrylate, alkyl-modified dipentaerythritol penta(meth)acrylate, succinic anhydride-modified dipentaerythritol penta(meth)acrylate, urethane tri(meth)acrylate, urethane hexa(meth)acrylate and ester hexa(meth)acrylate.

These polyfunctional (meth)acrylates may be used alone or in combination of two or more kinds. When excellent photocurability (high sensitivity) is required of the color resin composition for color filters of the present invention, the polyfunctional monomer is preferably one having three or more polymerizable double bonds (trifunctional). Preferred are poly(meth)acrylates of trivalent or higher polyalcohols and dicarboxylic acid-modified products thereof. Concrete examples thereof include succinic acid-modified products of trimethylolpropane tri(meth)acrylate, pentaerythritol tri(meth)acrylate and pentaerythritol tri(meth)acrylate, succinic acid-modified products of pentaerythritol tetra(meth)acrylate, dipentaerythritol tetra(meth)acrylate, dipentaerythritol penta(meth)acrylate and dipentaerythritol penta(meth)acrylate, and dipentaerythritol hexa(meth)acrylate.

The content of the polyfunctional monomer used in the color resin composition for color filters of the present invention, is not particularly limited. However, it is generally about 5 to 500 parts by mass, preferably in the range of 20 to 300 parts by mass, relative to 100 parts by mass of the alkali-soluble resin. When the content of the polyfunctional monomer is smaller than the range, photocuring may not proceed sufficiently and the color resin composition exposed to light may be melted. When the content of the polyfunctional monomer is larger than the range, there may be a decrease in alkali developing properties.

<Photoinitiator>

The photoinitiator used in the color resin composition for color filters of the present invention, is not particularly limited and can be appropriately selected from various kinds of conventionally-known photoinitiators. Examples thereof include aromatic ketones such as benzophenone, Michler's ketone, 4,4'-bisdiethylaminobenzophenone, 4-methoxy-4'-dimethylaminobenzophenone, 2-ethylanthraquinone and phenanthrene; benzoin ethers such as benzoin methyl ether, benzoin ethyl ether and benzoin phenyl ether; benzoins such as methylbenzoin and ethylbenzoin; halomethyl oxadiazole compounds such as 2-(o-chlorophenyl)-4,5-phenylimidazole dimer, 2-(o-chlorophenyl)-4,5-di(m-methoxyphenyl) imidazole dimer, 2-(o-fluorophenyl)-4,5-diphenylimidazole dimer, 2-(o-methoxyphenyl)-4,5-diphenylimidazole dimer, 2,4,5-triarylimidazole dimer, 2-(o-chlorophenyl)-4,5-di(m-methylphenyl)imidazole dimer, 2-benzyl-2-dimethylamino-1-(4-morpholinophenyl)-butanone, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole; halomethyl-S-triazine compounds such as 2,4-bis(trichloromethyl)-6-p-methoxystyryl-S-triazine, 2,4-bis(trichloromethyl)-6-(1-p-dimethylaminophenyl 1,3-butadienyl)-S-triazine, 2-trichloromethyl-4-amino-6-p-methoxystyryl-S-triazine, 2-(naphtho-1-yl)-4,6-bis-trichloromethyl-S-triazine, 2-(4-ethoxynaphtho-1-yl)-4,6-bis-trichloromethyl-S-triazine, and 2-(4-butoxy-naphtho-1-yl)-4,6-bis-trichloromethyl-S-triazine; and others such as 2,2-dimethoxy-1,2-diphenylethane-1-on, 2-methyl-1-[4-(methylthio)phenyl]-2-morpholinopropanone, 1,2-benzyl-2-dimethylamino-1-(4-morpholinophenyl)-butanone-1,1-hydroxy-cyclohexyl-phenylketone, benzyl, benzoylbenzoic acid, methyl benzoylbenzoate, 4-benzoyl-4'-methyl diphenyl sulfide, benzil methyl ketal, dimethyl amino benzoate, p-isoamyl dimethylaminobenzoate, 2-n-butoxyethyl-4-dimethyl amino benzoate, 2-chlorothioxanthone, 2,4-diethylthioxanthone, 2,4-dimethylthioxanthone, isopropylthioxanthone, ethanone, 1-[9-ethyl-6-(2-methylbenzyl)-9H-carbazole-3-yl]-1-(o-acetyloxime), 4-benzoyl-methyl diphenyl sulfide, 1-hydroxy-cyclohexyl-phenylketone, 2-benzyl-2-(dimethylamino)-1-[4-(4-morpholinyl)phenyl]-1-butanone, 2-(dimethylamino)-2-[(4-methylphenyl)methyl]-1-[4-(4-morpholinyl)phenyl]-1-butanone, α-dimethoxy-α-phenylacetophenone, phenylbis (2,4,6-trimethylbenzoyl)phosphine oxide, and 2-methyl-1-[4-(methylthio)phenyl]-2-(4-morpholinyl)-1-propanone. These photoinitiators may be used alone or in combination of two or more kinds.

The content of the photoinitiator used in the color resin composition for color filters of the present invention, is generally about 0.01 to 100 parts by mass, preferably 5 to 60 parts by mass, relative to 100 parts by mass of the polyfunctional monomer. When the content is smaller than the range, sufficient polymerization reaction may not be caused, so that the hardness of color layers may not be sufficient. When the content is larger than the range, the content of the color material and so on in the solid of the color resin composition for color filters is relatively small, so that sufficient color concentration may not be obtained.

(2) Thermosetting Binder Component

As the thermosetting binder component, a combination of a curing agent and a compound having two or more thermosetting functional groups per molecule is generally used. In addition, a catalyst which can promote thermosetting reaction can be added. As each of the thermosetting functional groups, there may be mentioned an epoxy group, oxetanyl group, isocyanate group, ethylenically unsaturated bond, etc. As each of the thermosetting functional groups, an epoxy group is preferably used. In addition, a polymer having no polymerization ability can be further used.

As the compound having two or more thermosetting functional groups per molecule, an epoxy compound having two or more epoxy groups per molecule is preferably used. The epoxy compound having two or more epoxy groups per molecule is an epoxy compound having two or more epoxy groups, preferably 2 to 50 epoxy groups, more preferably 2 to 20 epoxy groups, per molecule (including those referred to as epoxy resins). The epoxy groups are only required to have an oxirane ring structure, and there may be mentioned glycidyl groups, oxyethylene groups and epoxycyclohexyl groups, for example. As the epoxy compound, there may be mentioned conventionally-known polyvalent epoxy compounds curable by carboxylic acid. Such epoxy compounds are widely disclosed in references such as "The epoxy resin handbook" (edited by Masaki Jinbo, published by Nikkan Kogyo Shimbun Ltd. (1987)) and they can be used as the epoxy compound.

i) Compound Having Two or More Thermosetting Functional Groups Per Molecule

As the epoxy compound which has a relatively high molecular weight and is generally used as a curable binder component (hereinafter may be referred to as "binder type epoxy compound"), there may be used a polymer which comprises at least a constitutional unit represented by the following general formula (viii) and a constitutional unit represented by the following general formula (ix) and which has two or more glycidyl groups:

wherein $R^{21}$ is a hydrogen atom or an alkyl group having 1 to 3 carbon atoms, and $R^{22}$ is a hydrocarbon group having 1 to 12 carbon atoms; and

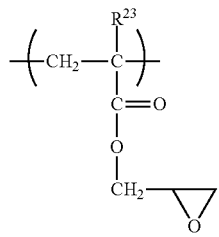

(ix)

wherein $R^{23}$ is a hydrogen atom or an alkyl group having 1 to 10 carbon atoms.

By using the constitutional unit represented by the formula (viii) as a constitutional unit of the binder type epoxy compound, sufficient hardness and transparency can be provided to the cured coating film formed from the resin composition of the present invention. In the formula (viii), $R^{21}$ is preferably a hydrogen or methyl group; $R^{22}$ is a hydrocarbon group having 1 to 12 carbon atoms, which may be any one of an linear aliphatic hydrocarbon group, an alicyclic hydrocarbon group and an aromatic hydrocarbon group, and which also may contain an additional structure such as double bond, a side chain of a hydrocarbon group, a side chain of a spiro ring, an endocyclic cross-linked hydrocarbon group, etc.

Concrete examples of monomers which can derive the constitutional unit represented by the formula (viii) include methyl (meth)acrylate, ethyl (meth)acrylate, i-propyl (meth)acrylate, n-propyl (meth)acrylate, i-butyl (meth)acrylate, n-butyl (meth)acrylate, t-butyl (meth)acrylate, 2-ethylhexyl (meth)acrylate, hexyl (meth)acrylate, octyl (meth)acrylate, lauryl (meth)acrylate, cyclohexyl (meth)acrylate, para-t-butyl cyclohexyl (meth)acrylate, isobornyl (meth)acrylate, benzyl (meth)acrylate, dicyclopentenyl (meth)acrylate and phenyl (meth)acrylate.

The constitutional unit represented by the formula (ix) is used to introduce an epoxy group (epoxy reaction site) in the polymer. The resin composition comprising the polymer has excellent storage stability and is unlikely to cause viscosity increase during storage and ejection. One of the reasons is estimated to be that the epoxy group in the formula (ix) is a glycidyl group.

In the formula (ix), $R^{23}$ is preferably a hydrogen or methyl group. Concrete examples of monomers which can derive the constitutional unit represented by the formula (ix) include glycidyl (meth)acrylate, and particularly preferred is glycidyl methacrylate (GMA).

The polymer may be a random copolymer or block copolymer. Also, the polymer may contain a main chain constitutional unit other than the formula (viii) or (ix) as long as the properties required of the fine portions of a color filter can be ensured, such as hardness and transparency. Concrete examples of such monomers include acrylonitrile and styrene.

The content ratio between the constitutional units represented by the formula (viii) and the constitutional units represented by the formula (ix) in the binder type epoxy compound is preferably in the range of 10:90 to 90:10. When the amount of the constitutional units represented by the formula (viii) exceeds the ratio 90:10, curing reaction sites decrease and may result in a decrease in cross-linking density. On the other hand, when the amount of the constitutional units represented by the formula (ix) exceeds the ratio 10:90, bulky portions decrease and may result in an increase in curing shrinkage.

The mass average molecular weight of the binder type epoxy compound is preferably 3,000 or more, particularly preferably 4,000 or more, in terms of polystyrene-equivalent mass average molecular weight. This is because the physical properties required of the cured layer used as one of the fine portions of a color filter, such as hardness and solvent resistance, are likely to be poor when the molecular weight of the binder type epoxy compound is smaller than 3,000. On the other hand, the mass average molecular weight of the binder type epoxy compound is preferably 20,000 or less, particularly preferably 15,000 or less, in terms of polystyrene-equivalent mass average molecular weight. This is because when the molecular weight is larger than 20,000, viscosity increase is likely to occur and may result in poor sustainability of drop mass magnitude of the ink ejected from an ink-jet head or on the straightness of drop direction, or may result in poor long-term storage stability of ink. The binder type epoxy compound can be synthesized by the method as disclosed in paragraph 0148 of Japanese Patent Application Laid-Open (JP-A) No. 2006-106503, for example.

As the thermosetting binder, there may be used an epoxy compound having two or more epoxy groups per molecule (hereinafter may be referred to as "polyfunctional epoxy compound") and a molecular weight smaller than the binder type epoxy compound. It is particularly preferable to use a combination of the binder type epoxy compound and the polyfunctional epoxy compound, as mentioned above. In this case, the polystyrene-equivalent mass average molecular weight of the polyfunctional epoxy compound is preferably 4,000 or less, particularly preferably 3,000 or less, based on the condition that the polystyrene-equivalent mass average molecular weight is smaller than that of the binder type epoxy compound to be combined therewith. When a polyfunctional epoxy compound having a relatively small molecular weight is mixed with the resin composition, epoxy groups are added to the resin composition, so that there is an increase in the concentration of epoxy reaction sites and thus an increase in cross-linking density.

Of polyfunctional epoxy compounds, it is preferably to use an epoxy compound having four or more epoxy groups per molecule, in order to increase cross-linking density resulted from acid-epoxy reaction. Especially in the case where the mass average molecular weight of the binder type epoxy compound is, in order to increase ejecting performance from an ink-jet head, 10,000 or less, the strength and hardness of the cured layer are likely to decrease. Therefore, it is preferable to add such a tetrafunctional or more polyfunctional epoxy compound to the resin composition to sufficiently increase the cross-linking density.

The polyfunctional epoxy compound is not particularly limited as long as it has two or more epoxy groups per molecule. For example, there may be used bisphenol A type epoxy resin, bisphenol F type epoxy resin, brominatedbisphenol A type epoxy resin, bisphenol S type epoxy resin, diphenyl ether type epoxy resin, hydroquinone type epoxy resin, naphthalene type epoxy resin, biphenyl type epoxy resin, fluorene type epoxy resin, phenol novolac type epoxy resin, orthcresol novolac type epoxy resin, trishydroxyphenylmethane type epoxy resin, trifunctional type epoxy resin, tetraphenylolethane type epoxy resin, dicyclopentadiene phenol type epoxy resin, hydrogenerated bisphenol A type epoxy resin, polyol-containing bisphenol A type epoxy resin, polypropylene glycol type epoxy resin, glycidyl ester type epoxy resin, glycidyl amine type epoxy resin, glyoxal type epoxy resin, alicyclic epoxy resin and heterocyclic epoxy resin.

In particular, for example, there may be mentioned bisphenol A type epoxy resin such as Epikote 828 (product name, manufactured by Japan Epoxy Resins Co., Ltd.), bisphenol F type epoxy resin such as YDF-175S (product name, manufactured by Tohto Kasei Co., Ltd.), brominated bisphenol A type epoxy resin such as YDB-715 (product name, manufactured by Tohto Kasei Co., Ltd.), bisphenol S type epoxy resin such as EPICLON EXA1514 (product name, manufactured by Dainippon Ink and Chemicals Inc.), hydroquinone type epoxy resin such as YDC-1312 (product name, manufactured by Tohto Kasel Co., Ltd.), naphthalene type epoxy resin such as EPICLON EXA4032 (product name, manufactured by Dainippon Ink and Chemicals Inc.), biphenyl type epoxy resin such as Epikote YX4000H (Japan Epoxy Resins Co., Ltd.), bisphenol A type novolac epoxy resin such as Epikote 157S70 (product name, manufactured by Japan Epoxy Resins Co., Ltd.), phenol novolac type epoxy resin such as Epikote 154 (Japan Epoxy Resins Co., Ltd.) and YDPN-638 (Tohto Kasei Co., Ltd.), cresol novolac type epoxy resin such as YDCN-701 (Tohto Kasei Co., Ltd.), dicyclopentadiene phenol type epoxy resin such as EPICLON HP-7200 (Dainippon Ink and Chemicals Inc.), trishydroxyphenylmethane type epoxy resin such as Epikote 1032H60 (Japan Epoxy Resins Co., Ltd.), trifunctional epoxy resin such as VG3101M80 (Mitsui Chemicals, Inc.), tetraphenylolethane type epoxy resin such as Epikote 1031S (Japan Epoxy Resins Co., Ltd.), tetrafunctional epoxy resin such as DENACOL EX-411 (Nagase Chemicals Ltd.), hydrogenated bisphenol A type epoxy resin such as ST-3000 (Tohto Kasei Co., Ltd.), glycidyl ester type epoxy resin such as Epikotel90P (Japan Epoxy Resins Co., Ltd.), glycidyl amine type epoxy resin such as YH-434 (Tohto Kasei Co., Ltd.), glyoxal type epoxy resin such as YDG-414 (Tohto Kasei Co., Ltd.), alicyclic polyfunctional epoxy resins such as EPOLEAD GT-401 (DAICEL Chemical Industries, Ltd.) and EHPE3150 (DAICEL Chemical Industries, Ltd.) and heterocyclic epoxy resin such as triglycidyl isocyanate (TGIC). As needed, an epoxy-reactive diluent may be added, such as NEOTOHTO E (Tohto Kasei Co., Ltd.)

The content of the binder type epoxy compound and that of the polyfunctional epoxy compound, which is added as needed, are as follows, in terms of mass ratio. Preferably, the binder type epoxy compound is 10 to 80 parts by mass and the polyfunctional epoxy compound is 10 to 60 parts by mass. More preferably, the binder type epoxy compound is 20 to 60 parts by mass and the polyfunctional epoxy compound is 20 to 50 parts by mass. Particularly preferably, the binder type epoxy compound is 30 to 40 parts by mass and the polyfunctional epoxy compound is 25 to 35 parts by mass.

ii) Curing Agent

The binder component used in the present invention is generally used in combination with a curing agent. As the curing agent used, for example, polycarboxylic acid anhydride or polycarboxylic acid is used. Concrete examples of polycarboxylic acid anhydride include aliphatic or alicyclic dicarboxylic anhydride such as phthalic anhydride, itaconic anhydride, succinic anhydride, citraconic anhydride, dodecenyl succinic anhydride, tricarballylic anhydride, maleic anhydride, hexahydrophthalic anhydride, dimethyltetrahydrophthalic anhydride, himic anhydride and nadic anhydride; aliphatic polycarboxylic acid dianhydride such as 1,2,3,4-butanetetracarboxylic dianhydride and cyclopentanetetracarboxylic dianhydride; aromatic polycarboxylic acid anhydride such as pyromellitic dianhydride, trimellitic anhydride and benzophenonetetracarboxylic anhydride; and ester group-containing acid anhydride such as ethylene glycol bistrimellitate and glycerin tristrimellitate. Particularly preferred is aromatic polycarboxylic acid anhydride. Also, epoxy resin curing agents comprising commercially-available carboxylic anhydride are suitably used.

Concrete examples of the polycarboxylic acid used in the present invention include aliphatic polycarboxylic acid such as succinic acid, glutaric acid, adipic acid, butanetetracarboxylic acid, maleic acid and itaconic acid; aliphatic polycarboxylic acid such as hexahydrophtalic acid, 1,2-cyclohexanedicarboxylic acid, 1,2,4-cyclohexanetricarboxylic acid and cyclopentanetetracarboxylic acid; and aromatic polycarboxylic acid such as phthalic acid, isophthalic acid, terephthalic acid, pyromellitic acid, trimellitic acid, 1,4,5,8-naphthalenetetracarboxylic acid and benzophenonetetracarboxylic acid. Preferred is aromatic polycarboxylic acid.

These curing agents can be used alone or in combination of two or more kinds. The amount of the curing agent used in the present invention is generally in the range of 1 to 100 parts by mass, preferably 5 to 50 parts by mass, relative to 100 parts by mass of the epoxy group-containing component (the total amount of the binder type epoxy compound and the polyfunctional epoxy compound). When the amount of the curing agent is less than 1 part by mass, curing is sufficient and may result in a failure to produce a tough coating film. When the amount of the curing agent exceeds 100 parts by mass, the adhesion properties of the coating film to the substrate may be poor.

iii) Catalyst

To increase the hardness and heat resistance of the cured film, a catalyst may be added to the binder component used in the present invention, which can promote thermosetting reaction between acid and epoxy. As such a catalyst, there may be used a thermal potential catalyst which shows activity upon heat-curing.

A thermal potential catalyst is a catalyst which shows catalytic activity, promotes curing reaction and provides excellent physical properties to the thus-obtained cured product when heated, and which is added as needed. In the present invention, the thermal potential catalyst is preferably one which shows acid catalytic activity at a temperature of 60° C. or more. Examples thereof include a compound obtained by neutralizing protonic acid with Lewis base, a compound obtained by neutralizing Lewis acid with Lewis base, a mixture of Lewis acid and trialkyl phosphate, sulfonic esters and onium compounds. There may be used various kinds of compounds as disclosed in JP-A No. H04-218561.

In general, the thermal potential catalyst is used in an amount of about 0.01 to 10.0 parts by mass, relative to the total of the curing agent and the compound having two or more thermosetting functional groups per molecule, that is, 100 parts by mass of the agent and compound.

(Optionally-Added Compounds)

As needed, the color resin composition for color filters of the present invention may further comprise a pigment or various kinds of additives, as long as there is no deterioration in the object of the present invention.

(Pigment)

The pigment is added in order to control color tone. It can be selected from conventionally-known pigments, according to the purpose, and such pigments can be used alone or in combination of two or more kinds.

As the pigment, for example, there may be mentioned C.I. pigment violet 1, C.I. pigment violet 19, C.I. pigment violet 23, C.I. pigment violet 29, C.I. pigment violet 32, C.I. pigment violet 36 and C.I. pigment violet 38; and C.I. pigment blue 15, C.I. pigment blue 15:3, C.I. pigment blue 15:4, C.I. pigment blue 15:6 and C.I. pigment blue 60.

The content of the pigment is not particularly limited as long as the effects of the present invention are not undermined. For example, the content of the pigment is as follows: the mass ratio between the color material represented by the general formula (I) and the pigment is preferably 9:1 to 4:6, more preferably 8:2 to 5:5, particularly preferably 7:3 to 5:5. This is because when the pigment content is in this range, color tone can be controlled without undermining the high transmittance exerted by the color material represented by the general formula (I).

(Additives)

Examples of additives include a polymerization terminator, a chain transfer agent, a leveling agent, a plasticizer, a surfactant, a defoaming agent, a silane coupling agent, an ultraviolet absorber and an adhesion enhancing agent.

Examples of surfactants that can be used in the present invention include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, fatty acid-modified polyesters and tertiary amine-modified polyurethanes. Also, there may be used a fluorine-containing surfactant.

Examples of plasticizers include dibutyl phthalate, dioctyl phthalate and tricresyl phosphate. As the defoaming agent and leveling agent, there may be mentioned silicon-containing, fluorine-containing, and acrylic-type compounds, for example.

(The Content of Each Component in the Color Resin Composition for Color Filters)

The total content of the color material represented by the general formula (I) and the pigment added as needed, is preferably 5 to 65% by mass, more preferably 8 to 55% by mass, relative to the total solid content of the color resin composition for color filters. When the content of the color material is small, insufficient color concentration may provided to the layer obtained by applying the color resin composition for color filters to achieve a predetermined, thickness (generally 1.0 to 5.0 μm). When the content of the color material, etc., is large, insufficient layer properties may be provided to the layer obtained by applying the color resin composition to a substrate and curing the same, such as adhesion properties to the substrate, surface roughness and hardness of the layer. In addition, properties such as solvent resistance may be insufficient since the content ratio of the dispersant used for dispersion of the color material in the color resin composition for color filters, is also large. In the present invention, "solid content" includes all the above-described components other than the solvent, and it also includes the polyfunctional monomer and the like dissolved in the solvent.

Also, the content of the dispersant is not particularly limited as long as it is able to homogeneously disperse the color material. For example, the dispersant content is 10 to 150 parts by mass, relative to 100 parts by mass of the color material. More preferably, the content is 15 to 45 parts by mass, particularly preferably 15 to 40 parts by mass, relative to 100 parts by mass of the color material. The total content of the dispersant is preferably in the range of 1 to 60% by mass, particularly preferably 5 to 50% by mass, relative to the total solid content of the color resin composition for color filters. When the content is less than 1% by mass, it may be difficult to homogeneously disperse the color material. When the content exceeds 60% by mass, there may be a decrease in curing and developing properties.

The total amount of the binder component is 24 to 94% by mass, preferably 40 to 90% by mass, relative to the total solid content of the color resin composition for color filters.

The content of the solvent is not particularly limited as long as a color layer can be formed with accuracy. In general, the content is preferably in the range of 65 to 95% by mass, particularly preferably in the range of 75 to 88% by mass, relative to the total amount of the color resin composition for color filters, including the solvent. When the content of the solvent is in the range, excellent coatability can be provided to the color resin composition.

(Production of the Color Resin Composition for Color Filters)

As the method for producing the color resin composition for color filters, for example, there may be mentioned (1) a method in which the above-described color material dispersion liquid of the present invention, the binder component and various additives used as needed, are added to the solvent at the same time and mixed, and (2) a method in which the binder component and various additives used as needed are added to the solvent and mixed; thereafter, the color material dispersion liquid of the present invention is added to the mixture and mixed.

Next, the color filter of the present invention will be explained.

[Color Filter]

The color filter of the present invention comprises at least a transparent substrate and color layers present on the substrate, wherein at least one of the color layers is a color layer which is a cured product of the above-described color resin composition.

Such a color filter of the present invention will be explained, with reference to figures. FIG. 1 is a schematic cross-sectional view showing an example of the color filter of the present invention. FIG. 1 shows that a color filter 10 of the present invention comprises transparent substrate 1, a light shielding part 2 and a color layer 3.

(Color Layer)

The color layer used in the color filter of the present invention is not particularly limited as long as it is a cured product of the above-described color resin composition for color filters of the present invention. However, it is generally formed on an opening of the light shielding part on the below-described transparent substrate and generally composed of color patterns in three or more colors.

The arrangement of the color layers is not particularly limited and may be a general arrangement such as a stripe type, a mosaic type, a triangle type or a four-pixel arrangement type. The width, area, etc., of the color layer can be determined appropriately.

The thickness of the color layer is appropriately controlled by controlling the applying method, solid content concentration, viscosity, etc., of the color resin composition for color filters. In general, the thickness is preferably in the range of 1 to 5 μm For example, when the color resin composition is a photosensitive resin composition, the color layer can be formed by the following method.

First, the above-described color resin composition for color filters of the present invention is applied onto the below-described transparent substrate by a coating method such as a spray coating method, a dip coating method, a bar coating method, a roll coating method or a spin coating method to form a wet coating film.

Then, the wet coating film is dried with a hot plate or oven. The dried film is subjected to exposure through a mask with a given pattern to cause a photopolymerization reaction of the alkali-soluble resin, the polyfunctional monomer, etc., thereby obtaining a coating film of the color resin composition for color filters. Examples of light sources and lights that can be used for the exposure include a low pressure mercury lamp, a high pressure mercury lamp and a metal halide lamp, and ultraviolet rays and electron beams. The exposure amount is appropriately controlled, according to the used light source and the thickness of the coating film.

The film may be heated to promote polymerization reaction after the exposure. The heating condition is appropriately determined, depending on the content ratio of the components used in the color resin composition for color filters of the present invention, the thickness of the coating film, etc.

Next, the thus-obtained film is developed with a developing solution to dissolve and remove unexposed portions, thereby forming a coating film in a desired pattern. As the developing solution, a solution obtained by dissolving alkali in water or aqueous solvent, is generally used. An appropriate amount of surfactant, etc., may be added to the alkali solution. The developing method can be selected from general developing methods.

After the developing treatment, generally, the developing solution is rinsed off, followed by drying of the cured coating film of the color resin composition for color filters, thereby forming a color layer. A heating treatment may be performed after the developing treatment to sufficiently cure the coating film. The heating condition is not particularly limited and appropriately determined depending on the intended use of the coating film.

The color layer can be formed by the following method, in the case of forming the layer by the ink-jet method, for example.

First, color resin compositions for color filters are prepared, each of which comprising any one of color materials including blue (B), green (G) and red (R) color materials and at least one of which comprising the color resin composition for color filters of the present invention. Then, the thus-prepared color resin compositions for color filters are selectively attached by the ink-jet method to color layer forming regions (regions for forming R, G, B layers) defined by the pattern of the light shielding part on a surface of the transparent substrate 1, thus forming ink layers. In this ink applying process, the color resin compositions for color filters are likely to cause an increase in viscosity at the end of the ink-jet head and are needed to maintain excellent ejection performance. The color resin compositions (R, G, B) can be applied onto the substrate with multiple ink-jet heads, so that they can provide higher work efficiency than the case of forming R, G, B color layers, layer by layer, by the printing method, etc.

Next, the R, G, B color layers are dried, pre-baked (as needed) and then appropriately heated or exposed to light, thereby curing the color layers. When the color layers are appropriately heated or exposed to light, the cross-linking components in the curable resin compositions contained in the color resin compositions for color filters are cross-linked to cure the ink layers, thus forming color layers 3R, 3G, 3B.

(Light Shielding Part)

The light shielding part in the color filter of the present invention is formed in pattern on the below-described transparent substrate and may be those which are used in general color filters.

The pattern shape of the light shielding part is not particularly limited, and examples thereof include a stripe-shaped pattern, a matrix-shaped patter, etc. As the light shielding pattern, for example, there may be mentioned one produced by dispersing or dissolving a black pigment in a binder resin, and thin metal layers of chromium, chromium oxide, etc. When the light shielding part is such a thin metal layer, the layer may be a stack of two layers of one $CrO_x$ layer ("x" is an arbitrary number) and one Cr layer, or may be a stack of three layers of one $CrO_x$ layer ("x" is an arbitrary number), one $CrN_y$ layer ("y" is an arbitrary number) and one Cr layer, the stack of three layers having a further reduced reflectance.

When the light shielding part is one produced by dispersing or dissolving a black colorant in a binder resin, the method for producing the light shielding part is not particularly limited and is only required to be a method which can pattern the light shielding part. For example, there may be mentioned a photolithography method using the color resin composition for color filters for the light shielding part, a printing method using the same, an ink-jet method using the same, etc.

In the case as described above and when using a printing method or ink-jet method to produce the light shielding part, as the binder resin, there may be mentioned polymethyl methacrylate resin, polyacrylate resin, polycarbonate resin, polyvinyl alcohol resin, polyvinylpyrrolidone resin, hydroxylethyl cellulose resin, carboxymethyl cellulose resin, polyvinyl chloride resin, melamine resin, phenol resin, alkyd resin, epoxy resin, polyurethane resin, polyester resin, maleic acid resin or polyamide resin, for example.

In the case as described above and when using a photolithography method to form the light shielding part, as the binder resin, there may be used reactive vinyl group-containing photosensitive resin such as acrylate-based, methacrylate-based, polyvinyl cinnamate-based or cyclized rubber-based photosensitive resin, for example. In this case, a photopolymerization initiator may be added to the color resin composition for forming the light shielding part, the composition comprising a black colorant and a photosensitive resin. In addition, a sensitizer, a coatability improving agent, a development modifier, a cross-linking agent, a polymerization inhibitor, a plasticizer, a flame retardant, etc., may be added thereto.

When the light shielding part is a thin metal layer, the method of forming such a light shielding part is not particularly limited as long as the method allows patterning of the light shielding part. The examples include a photolithography method, a deposition method using a mask, and a printing method, for example.

When the light shielding part is a thin metal layer, the thickness is about 0.2 to 0.4 µm. When the light shielding part is formed from the black colorant dispersed or dissolved in the binder resin, the thickness is about 0.5 to 2 µm.

(Transparent Substrate)

The transparent substrate of the color filter of the present invention is not particularly limited as long as it is a substrate transparent to visible light. It can be selected from general transparent substrates used in color filters. Concrete examples thereof include inflexible, transparent rigid materials such as silica glass plate, non-alkali glass plate and synthetic silica plate, and transparent, flexible materials such as transparent resin film and optical resin plates.

The thickness of the transparent substrate is not particularly limited. However, depending on the intended use of the color filter of the present invention, one having a thickness of about 100 μm to 1 mm can be used, for example.

In addition to the transparent substrate, the light shielding part and the color layer, the color filter of the present invention may also comprise an overcoat layer and a transparent electrode layer, for example. Moreover, an orientation layer and a columnar spacer may be formed in the coating layer.

Next, the liquid crystal display device of the present invention will be explained.

[Liquid Crystal Display Device]

The liquid crystal display device of the present invention comprises the above-described color filter of the present invention, a counter substrate, and a liquid crystal layer present between the color layer and the counter substrate.

Such a liquid crystal display device of the present invention will be explained with reference to figures. FIG. 2 is a schematic view showing an example of the liquid crystal display device of the present invention. As shown in FIG. 2, the liquid crystal display device of the present invention, liquid crystal display device 40, comprises a color filter 10, a counter substrate 20 comprising a TFT array substrate, etc., and a liquid crystal layer 3 formed between the color filter 10 and the counter substrate 20.

The liquid crystal display device of the present invention is not limited to the configuration shown in this FIG. 2. It can be a configuration which is generally known as a liquid crystal display device comprising a color filter.

The method for driving the liquid crystal display device of the present invention is not particularly limited and can be selected from driving methods which are generally used in liquid crystal display devises. Examples of such driving methods include a TN method, an IPS method, an OCB method and an MVA method. In the present invention, any of these methods can be suitably used.

The counter substrate can be appropriately selected depending on the driving method, etc., of the liquid crystal display device of the present invention.

Also, the liquid crystal comprising the liquid crystal layer can be selected from various liquid crystals with varying dielectric anisotropies and mixtures thereof, depending on the driving method, etc., of the liquid crystal display device of the present invention.

The method for forming the liquid crystal layer can be selected from methods which are generally used to produce liquid crystal cells. Examples thereof include a vacuum injection method and a liquid crystal dripping method.

In the vacuum injection method, for example, a liquid crystal cell is produced in advance, using a color filter and a counter substrate; liquid crystal is heated to become isotropic liquid; the liquid crystal is injected into the liquid crystal cell, in the form of isotropic liquid, using the capillary effect; the liquid crystal cell is encapsulated with an adhesive agent, thereby forming a liquid crystal layer; then, the encapsulated liquid crystal can be oriented by gradually cooling the liquid crystal cell to room temperature.

Next, the organic light-emitting display device of the present invention will be explained.

[Organic Light-Emitting Display Device]

The organic light-emitting display device of the present invention comprises the above-described color filter of the present invention and an organic light-emitting material.

Figure 3:
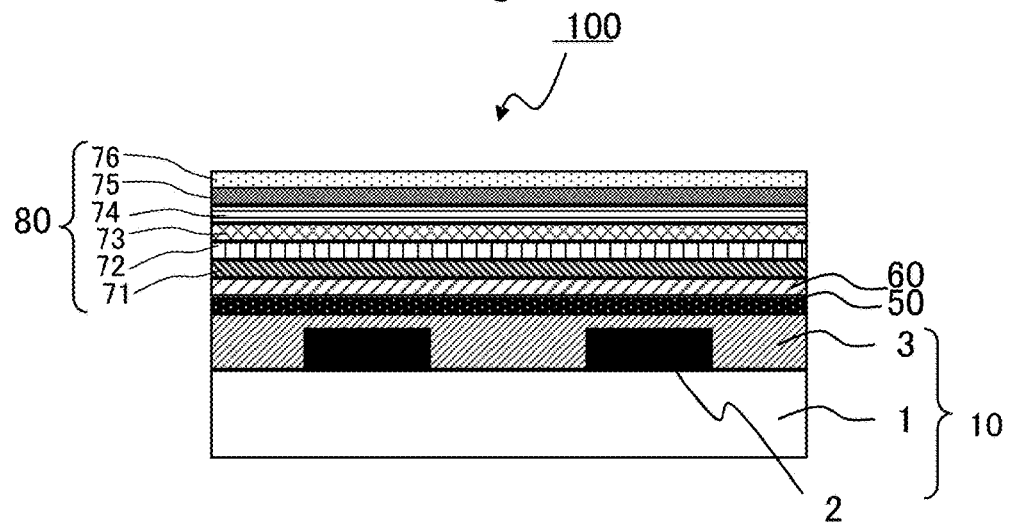
FIG. 3 is a schematic view showing an example of the organic light-emitting display device of the present invention.

Such an organic light-emitting display device of the present invention will be explained with reference to figures. FIG. 3 is a schematic view showing an example of the organic light-emitting display device of the present invention. As shown in FIG. 3, the organic light-emitting display device of the present invention, which is organic light-emitting display device 100, comprises a color filter 10 and an organic light-emitting material 80. An organic protection layer 50 and/or an inorganic oxide layer 60 may be present between the color filter 10 and the organic light-emitting material 80.

As the method for stacking the components of the organic light-emitting material 80, for example, there may be mentioned a method of stacking on the color filter a transparent positive electrode 71, a positive hole injection layer 72, a positive hole transport layer 73 a light-emitting layer 74, an electron injection layer 75 and a negative electrode 76 in this sequence, a method of attaching the organic light-emitting material 80 formed on a different substrate onto the inorganic oxide layer 60. In the organic light-emitting material 80, the transparent positive electrode 71, the positive hole injection layer 72, the positive hole transport layer 73, the light-emitting layer 74, the electron injection layer 75, the negative electrode 76 and other components may be selected from conventionally-known materials and used. The organic light-emitting display device 100 produced as above is applicable to passive or active drive organic EL displays, for example.

The organic light-emitting display device of the present invention is not limited to the configuration shown in FIG. 3. It may have any one of configurations which are generally known as those of organic light-emitting display devices comprising a color filter.

EXAMPLES

Hereinafter, the present invention will be explained in detail, with reference to examples. The scope of the present invention is not restricted by these examples, however.

Synthesis Example

Synthesis of Intermediate 1

First, 18.7 g (73.4 mmol) of 1-iodonaphthalene, 9.88 g (102.8 mmol) of sodium tert-butoxide (both manufactured by Wako Pure Chemical Industries, Ltd.), 5.0 g (36.7 mmol) of p-xylenediamine (manufactured by Tokyo Chemical Industry Co., Ltd.), 0.27 g (0.57 mmol) of 2-dicyclohexylphosphino-2',4',6'-triisopropylbiphenyl (manufactured by Aldrich) and 0.054 g (0.28 mmol) of palladium acetate (manufactured by Wako Pure Chemical Industries, Ltd.) were dispersed in 36 mL of xylene and reacted at 130 to 135° C. for 24 hours. After the reaction, the resultant was cooled to room temperature. Crystals thus precipitated were filtered and then washed with methanol. Next, the crystals were washed with water and dried to obtain 9.79 g (yield 69%) of intermediate 1 represented by the following chemical formula (1).

From the following analysis result, the obtained compound was confirmed to be a desired compound.

MS (ESI) (m/z): 389(+)

Values of elemental analysis: CHN actual measurement values (86.72%, 6.54%, 6.97%); theoretical values (86.56%, 6.23%, 7.21%)

Chemical Formula (1)

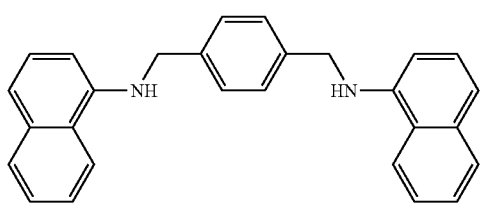

Synthesis Example

Synthesis of Intermediate 2

First, 10.0 g (25.7 mmol) of intermediate 1, 100 mL of toluene and 7.89 g (51.5 mmol) of phosphorus oxychloride (manufactured by Wako Pure Chemical Industries, Ltd.) were mixed and agitated. Next, 16.2 g (49.9 mmol) of 4,4'-bis(diethylamino)benzophenone (manufactured by Tokyo Chemical Industry Co., Ltd.) was added to the mixture, and the mixture was refluxed for 5 hours and cooled. After the reaction, the toluene was decanted. Then, 100 mL of water was added thereto, and the mixture was filtered to obtain a cake (resinous precipitate). The cake was dispersed in dilute hydrochloric acid. The dispersion was filtered, and a residue thus obtained was washed with water and then dried to obtain 18.4 g (yield 66%) of intermediate 2 represented by the following chemical formula (2).

From the following analysis result, the obtained compound was confirmed to be a desired compound.

MS (ESI) (m/z): 501(+), divalent

Values of elemental analysis: CHN actual measurement values (78.02%, 7.13%, 7.11%); theoretical values (78.26%, 7.32%, 7.82%)

Chemical Formula (2)

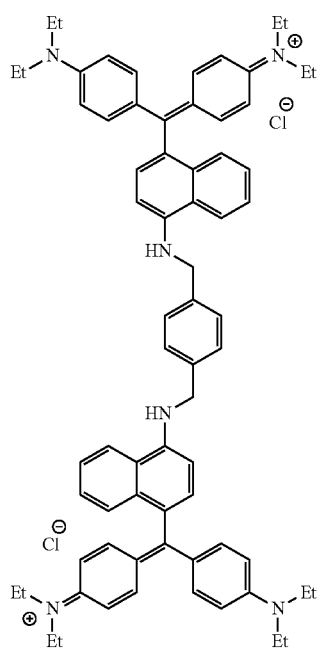

Production Example 1

Synthesis of Color Material A

First, 1.03 g (3.10 mmol) of disodium 2,6-naphthalenedisulfonate (manufactured by Tokyo Chemical Industry Co., Ltd.), 30 mL of methanol and 20 mL of water were mixed and agitated at 50 to 55° C. Next, 3.33 g (3.10 mmol) of intermediate 2 was added to the mixture, and the mixture was stirred at 50 to 55° C. for 1 hour. The solution was concentrated by means of an evaporator to evaporate the methanol, and 100 mL of water was added thereto. The mixture was filtered to obtain a precipitate, and the precipitate was washed with water. The thus-obtained cake was dried to obtain 3.37 g (yield 84%) of color material A represented by the following chemical formula (3).

From the following analysis result, the obtained compound was confirmed to be a desired compound.

MS (ESI) (m/z): 502(+), divalent, 143(−), divalent

Values of elemental analysis: CHN actual measurement values (74.68%, 6.63%, 6.21%); theoretical values (74.50%, 6.56%, 6.52%)

Chemical Formula (3)

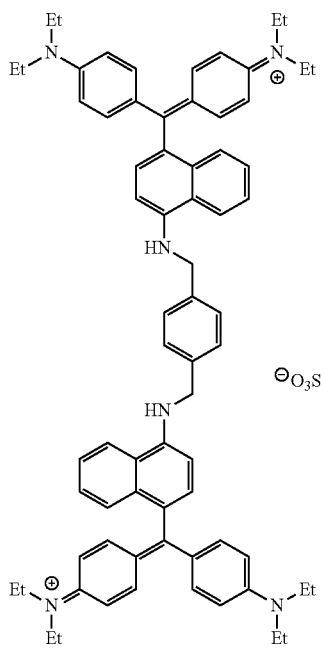

Production Example 2

Synthesis of Color Material B

First, 0.92 g (2.12 mmol) of trisodium 1,3,6-naphthalenetrisulfonate (manufactured by Tokyo Chemical Industry Co., Ltd.), 40 mL of methanol and 20 mL of water were mixed and agitated at 50 to 55° C. Next, 3.44 g (3.20 mmol) of intermediate 2 was added thereto, and the mixture was agitated at 50 to 55° C. for 1 hour. The solution was concentrated by means of an evaporator to evaporate the methanol, and 100 mL of water was added thereto. The mixture was filtered to obtain a precipitate, and the precipitate was washed with water. The thus-obtained cake was dried to obtain 3.12 g (yield 78%) of color material B represented by the following chemical formula (4).

From the following analysis result, the obtained compound was confirmed to be a desired compound.

MS (ESI) (m/z): 502(+), divalent, 121(−), trivalent

Values of elemental analysis: CHN actual measurement values (73.97%, 6.62%, 6.91%); theoretical values (73.84%, 6.57%, 6.74%)

Chemical Formula (4)

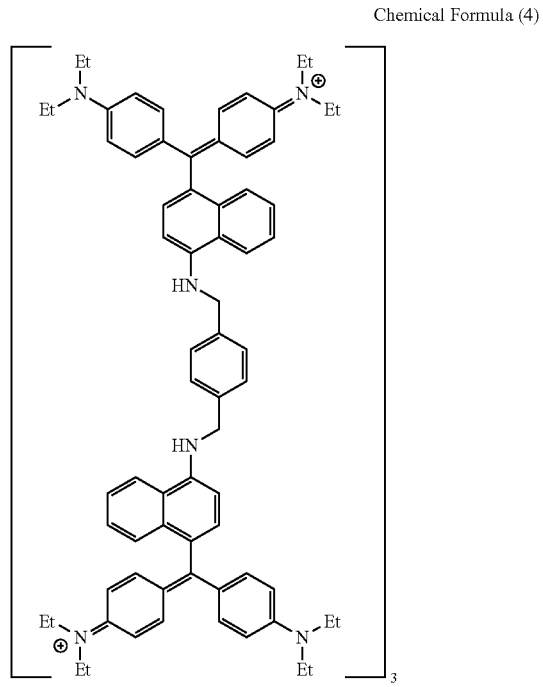

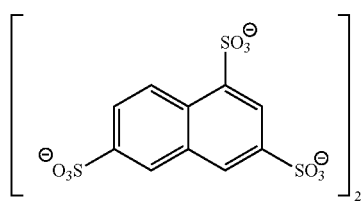

Synthesis Example

Synthesis of Intermediate 3

First, 15.2 g (60 mmol) of 1-iodonaphthalene (manufactured by Wako Pure Chemical Industries, Ltd.), 4.63 g (30 mmol) of norbornane diamine (NBDA) (CAS No. 56602-77-8) (manufactured by Mitsui Chemicals, Inc.), 8.07 g (84 mmol) of sodium tert-butoxide, 0.09 g (0.2 mmol) of 2-dicyclohexylphosphino-2',6',-dimethoxybiphenyl (manufactured by Aldrich) and 0.021 g (0.1 mmol) of palladium acetate (manufactured by Wako Pure Chemical Industries, Ltd.) were dispersed in 30 mL of xylene and reacted at 130 to 135° C. for 48 hours. After the reaction, the resultant was cooled to room temperature and water was added thereto. An organic phase was extracted from the resultant and dried with magnesium sulfate and then concentrated, thereby obtaining 8.5 g (yield 70%) of intermediate 3 represented by the following chemical formula (5).

From the following analysis result, the obtained compound was confirmed to be a desired compound.

MS (ESI) (m/z): 407(M+H)

Values of elemental analysis: CHN actual measurement values (85.47%, 8.02%, 6.72%); theoretical values (85.26%, 8.11%, 6.63%)

Chemical Formula (5)

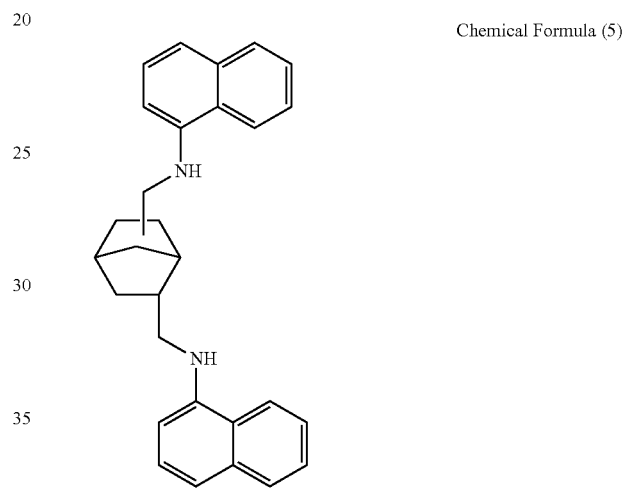

Synthesis Example

Synthesis of Intermediate 4

First, 8.46 g (20.8 mmol) of intermediate 3, 13.5 g (41.6 mmol) of 4,4'-bis(dimethylamino)benzophenone (manufactured by Tokyo Chemical Industry Co., Ltd.) and 60 mL of toluene were mixed and agitated at 45 to 50° C. Next, 6.38 g (51.5 mmol) of phosphorus oxychloride (manufactured by Wako Pure Chemical Industries, Ltd.) was added dropwise to the mixture, and the mixture was refluxed for 2 hours and then cooled. After the reaction, the toluene was decanted. A resinous precipitate thus obtained was dissolved by adding 40 mL of chloroform, 40 mL of water and concentrated hydrochloric acid to separate a chloroform phase. The chloroform phase was washed with water and dried with magnesium sulfate and then concentrated. To the thus-obtained concentrated product, 65 mL of ethyl acetate was added and refluxed. After cooling, the thus-produced precipitate was filtered off to obtain 15.9 g (yield 70%) of intermediate 4 represented by the following chemical formula (6).

From the following analysis result, the obtained compound was confirmed to be a desired compound.

MS (ESI) (m/z): 511(+), divalent

Values of elemental analysis: CHN actual measurement values (78.13%, 7.48%, 7.78%); theoretical values (78.06%, 7.75%, 7.69%)

Chemical Formula (6)

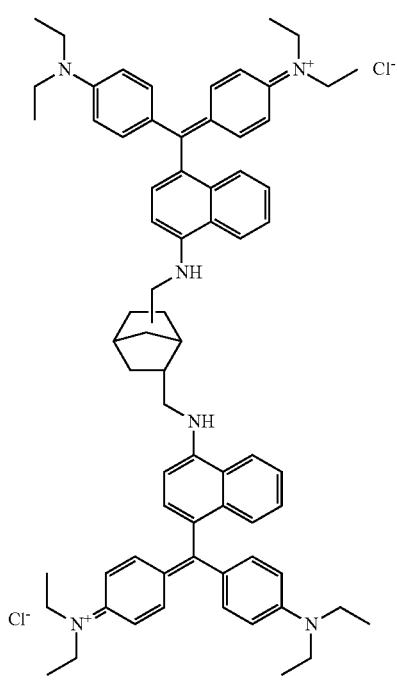

Production Example 3

Synthesis of Color Material C

First, 1.27 g (2.93 mmol) of trisodium 1,3,6-naphthalenetrisulfonate (manufactured by Tokyo Chemical Industry Co., Ltd.), 40 mL of methanol and 48 mL of water were mixed and agitated at 50 to 55° C. Next, 3.44 g (3.20 mmol) of intermediate 4 was added thereto, and the mixture was agitated at 50 to 55° C. for 1 hour. The solution was concentrated by means of an evaporator to evaporate the methanol, and 100 mL of water was added thereto. The mixture was filtered to obtain a precipitate, and the precipitate was washed with water. The thus-obtained cake was dried to obtain 4.9 g (yield 89%) of color material B represented by the following chemical formula (7).

From the following analysis result, the obtained compound was confirmed to be a desired compound.

MS (ESI) (m/z): 511(+), divalent, 121(−), trivalent

Values of elemental analysis: CHN actual measurement values (74.01%, 6.99%, 6.47%); theoretical values (73.74%, 6.96%, 6.54%)

Chemical Formula (7)

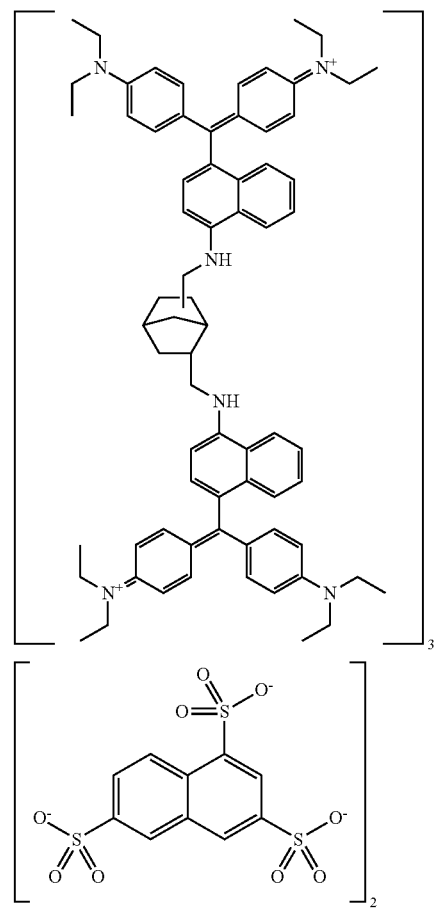

Production Example 4

Synthesis of Color Material D

First, 1.48 g (1.9 mmol) of Direct Blue 86 (manufactured by Tokyo Chemical Industry Co., Ltd.), 40 mL of methanol and 20 mL of water were mixed and agitated at 50 to 55° C. Next, 2.00 g (1.83 mmol) of intermediate 4 was added thereto, and the mixture was agitated at 50 to 55° C. for 1 hour. The solution was concentrated by means of an evaporator to evaporate the methanol, and 100 mL of water was added thereto. The mixture was filtered to obtain a precipitate, and the precipitate was washed with water. The thus-obtained cake was dried to obtain 1.60 g (yield 50%) of color material D represented by the following chemical formula (8).

From the following analysis result, the obtained compound was confirmed to be a desired compound.

MS (ESI) (m/z): 510(+), divalent, 369(−), divalent

Values of elemental analysis: CHN actual measurement values (70.41%, 5.80%, 10.94%); theoretical values (70.30%, 5.84%, 11.14%)

Chemical Formula (8)

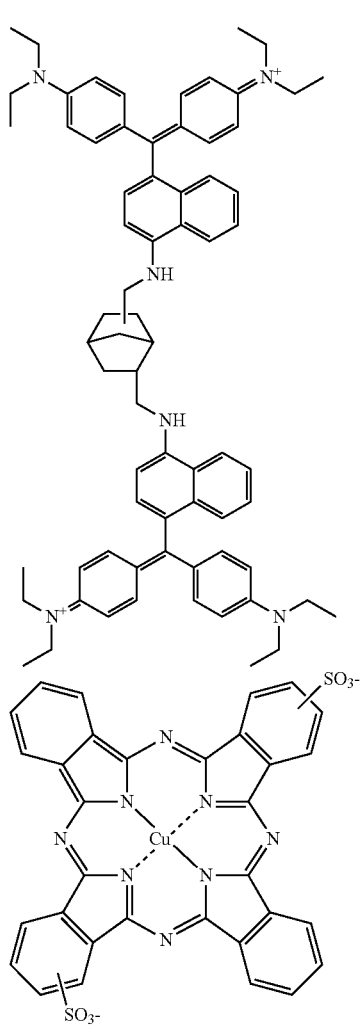

Chemical Formula (9)

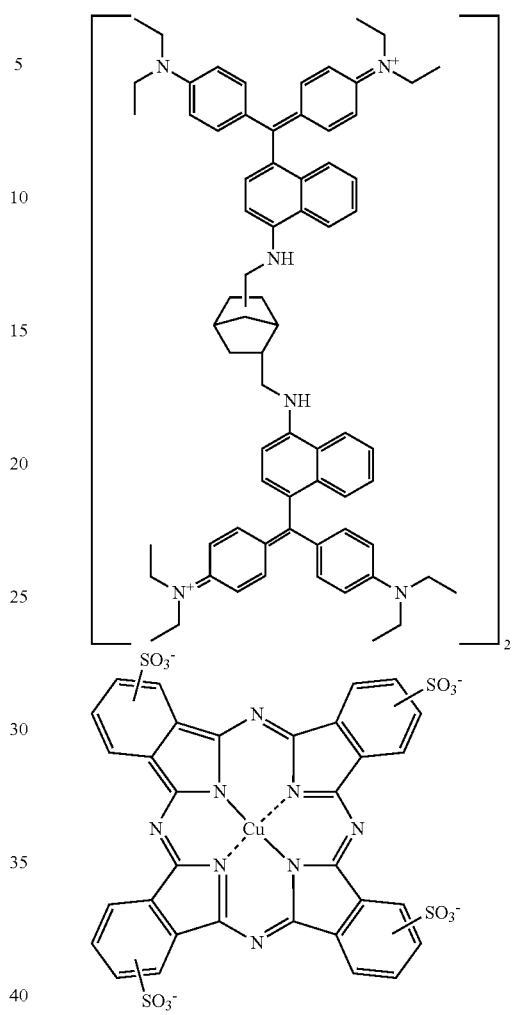

Production Example 5

Synthesis of Color Material E

First, 2.0 g (1.00 mmol) of copper(II) phthalocyanine tetrasulfonic acid tetrasodium salt (manufactured by Aldrich), 100 mL of methanol and 40 ml of water were mixed and agitated at 50 to 55° C. Next, 2.0 g (1.83 mmol) of intermediate 4 was added thereto, and the mixture was agitated at 50 to 55° C. for 1 hour. The solution was concentrated by means of an evaporator to evaporate the methanol, and 100 mL of water was added thereto. The mixture was filtered to obtain a precipitate, and the precipitate was washed with water. The thus-obtained cake was dried to obtain 2.4 g (yield 89%) of color material E represented by the following chemical formula (9).

From the following analysis result, the obtained compound was confirmed to be a desired compound.

MS (ESI) (m/z): 510(+), divalent, 224(−), tetravalent

Values of elemental analysis: CHN actual measurement values (64.32%, 5.41%, 10.11%); theoretical values (64.44%, 5.36%, 10.21%)

Production Example 6

Synthesis of Color Material F

First, 2.76 g of poly(sodium 4-styrenesulfonate) (weight average molecular weight (Mw) up to 70,000, 30 wt % aqueous solution) (manufactured by Aldrich), 100 mL of methanol and 50 mL of water were mixed and agitated at 50 to 55° C. Next, 2.0 g (1.83 mmol) of intermediate 4 was added thereto, and the mixture was agitated at 50 to 55° C. for 1 hour. The solution was concentrated by means of an evaporator to evaporate the methanol, and 100 mL of water was added thereto. The mixture was filtered to obtain a precipitate, and the precipitate was washed with water. The thus-obtained cake was dried to obtain 2.1 g (yield 82%) of color material F represented by the following chemical formula (10).

From the following analysis result, the obtained compound was confirmed to be a desired compound.

MS (ESI) (m/z): 510(+), divalent

Values of elemental analysis: CHN actual measurement values (75.87%, 7.17%, 6.25%); theoretical values (75.18%, 7.25%, 6.05%)

Chemical Formula (10)

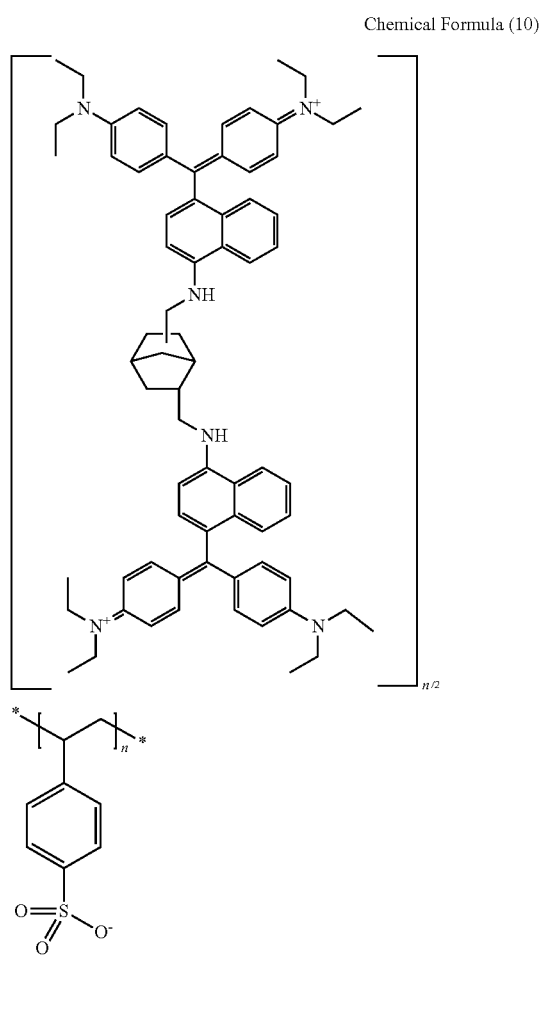

Production Example 7

Synthesis of Color Material G

First, 0.92 g (2.12 mmol) of trisodium 1,3,6-naphthalenetrisulfonate (manufactured by Tokyo Chemical Industry Co., Ltd.), 0.48 g of poly(sodium 4-styrenesulfonate) (weight average molecular weight (Mw) up to 70,000, 30 wt % aqueous solution), 40 mL of methanol and 20 mL of water were mixed and agitated at 50 to 55° C. Next, 3.44 g (3.20 mmol) of intermediate 4 was added thereto, and the mixture was agitated at 50 to 55° C. for 1 hour. The solution was concentrated by means of an evaporator to evaporate the methanol, and 100 mL of water was added thereto. The mixture was filtered to obtain a precipitate, and the precipitate was washed with water. The thus-obtained cake was dried to obtain 2.43 g (yield 59%) of color material G represented by the following chemical formula (11).

From the following analysis result, the obtained compound was confirmed to be a desired compound.

MS (ESI) (m/z): 510(+), divalent, 121(−), trivalent

Values of elemental analysis: CHN actual measurement values (74.22%, 7.34%, 6.21%); theoretical values (74.04%, 7.15%, 6.48%)

Chemical Formula (11)

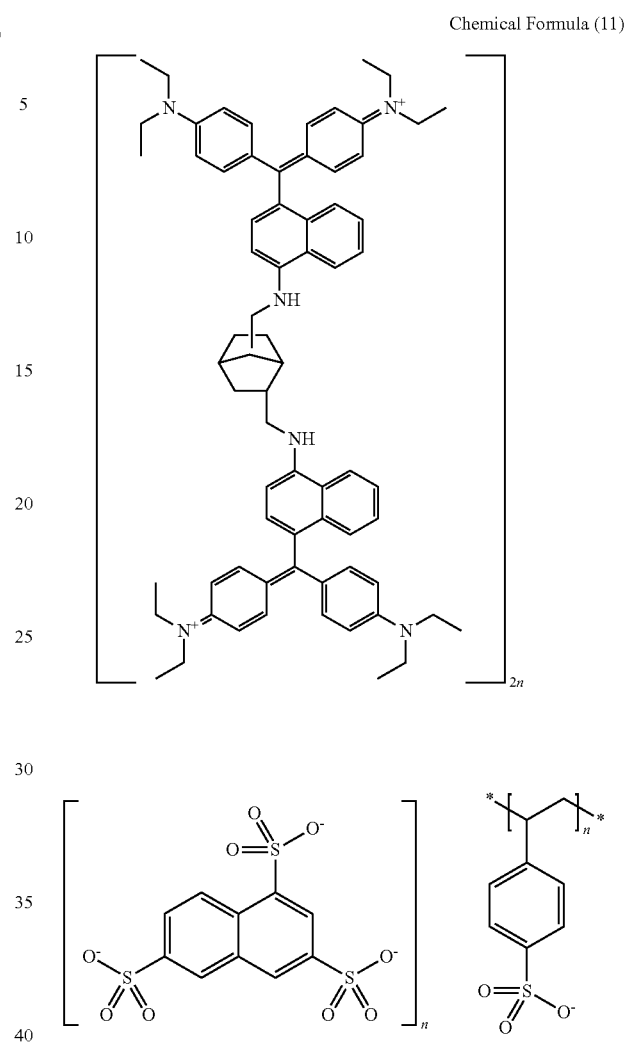

Production Example 8

Synthesis of Color Material H

First, 4.65 g (2.01 mmol) of 12-molybdo phosphoric acid n-hydrate (manufactured by Kanto Chemical Co., Inc.), 40 mL of methanol and 20 mL of water were mixed and agitated at 50 to 55° C. Next, 3.0 g (2.75 mmol) of intermediate 4 was added thereto, and the mixture was agitated at 50 to 55° C. for 1 hour. The solution was concentrated by means of an evaporator to evaporate the methanol, and 100 mL of water was added thereto. The mixture was filtered to obtain a precipitate, and the precipitate was washed with water. The thus-obtained cake was dried to obtain 5.6 g (yield 91%) of color material H represented by the following chemical formula (12).

From the following analysis result, the obtained compound was confirmed to be a desired compound.

MS (ESI) (m/z): 510(+), divalent, 607(−), trivalent

Values of elemental analysis: CHN actual measurement values (52.34%, 5.44%, 5.23%); theoretical values (52.13%, 5.61%, 5.14%)

Chemical Formula (12)

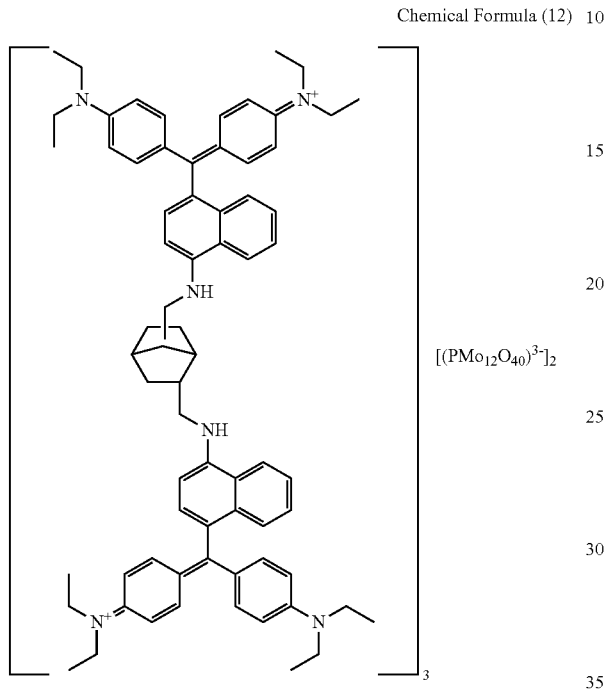

Chemical Formula (13)

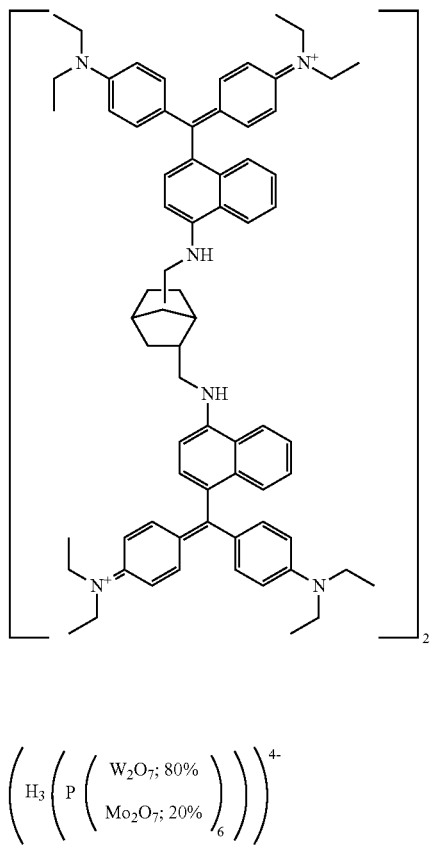

Production Example 9

Synthesis of Color Material I

First, 6.16 g (18.67 mmol) of sodium tungstate dihydrate (manufactured by Aldrich), 1.13 g (4.67 mmol) of sodium molybdate dihydrate (manufactured by Aldrich), 0.35 g (1.945 mmol) of sodium phosphate dibasic dihydrate, and 60 mL of water were mixed and acidified with hydrochloric acid. Next, a small amount of zinc powder was added thereto and agitated at 90 to 95° C. To this mixture, a methanol solution (40 ml) of 4.25 g (3.89 mmol) intermediate 4 was added and agitated at 50 to 55° C. for 1 hour. Then, 100 mL of water was added thereto, and the mixture was filtered to obtain a precipitate. The precipitate was washed with water. The thus-obtained cake was dried to obtain 7.1 g (yield 94%) of color material I represented by the following chemical formula (13).

From the following analysis result, the obtained compound was confirmed to be a desired compound.

MS (ESI) (m/z): 510(+), divalent

Values of elemental analysis: CHN actual measurement values (41.55%, 5.34%, 4.32%); theoretical values (41.66%, 5.17%, 4.11%)

Comparative Production Example 1

Synthesis of Color Material J

First, 1.62 g (50.2 mmol) of disodium naphthalene 2,6-sulfonate (manufactured by Tokyo Chemical Industry Co., Ltd.) was dissolved by heating at 50 to 55° C. in a mixture of 50 mL of methanol and 50 mL of water. Then, 5 g (97.3 mmol) of Basic Blue 7 (CT-42595) (manufactured by Tokyo Chemical Industry Co., Ltd.) was added thereto, and the mixture was agitated at the same temperature for 1 hour. The solution was concentrated by means of an evaporator to evaporate the methanol, and 100 mL of water was added thereto. The mixture was filtered to obtain a precipitate, and the precipitate was washed with water. The thus-obtained cake was dried under reduced pressure to obtain 5.2 g (yield 86%) of color material J represented by the following chemical formula (14).

From the following analysis result, the obtained compound was confirmed to be a desired compound.

MS (ESI) (m/z): 478(+), 143(2−) (divalent)

Values of elemental analysis: CHN actual measurement values (73.12%, 6.77%, 6.86%); theoretical value (73.40%)

Chemical Formula (14)

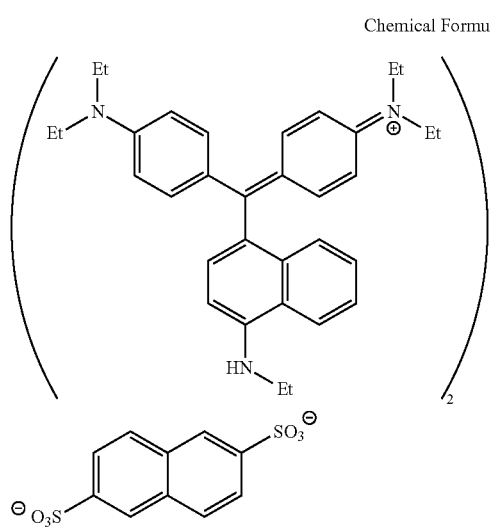

Comparative Production Example 2

Synthesis of Color Material K

First, 3.0 g (6.9 mmol) of trisodium naphthalene 1,3,6-sulfonate (manufactured by Tokyo Chemical Industry Co., Ltd.) was dissolved by heating at 50 to 55° C. in a mixture of 100 mL of methanol and 100 mL of water. Next, 10.7 g (20.7 mmol) of Basic Blue 7 (CI-42595) (manufactured by Tokyo Chemical Industry Co., Ltd.) was added thereto, and the mixture was agitated at the same temperature for 1 hour. The solution was concentrated by means of an evaporator to evaporate the methanol, and 30 mL of water was added thereto. The mixture was filtered to obtain a precipitate, and the precipitate was washed with water. The thus-obtained cake was dried under reduced pressure to obtain 11.2 g (yield 90%) of color material K represented by the following chemical formula (15).

From the following analysis result, the obtained compound was confirmed to be a desired compound.

MS (ESI) (m/z): 478(+), 122(3−) (trivalent)

Values of elemental analysis: CHN actual measurement values (72.88%, 6.78%, 6.85%); theoretical values (72.67%, 6.99%, 7.00%)

Chemical Formula (15)

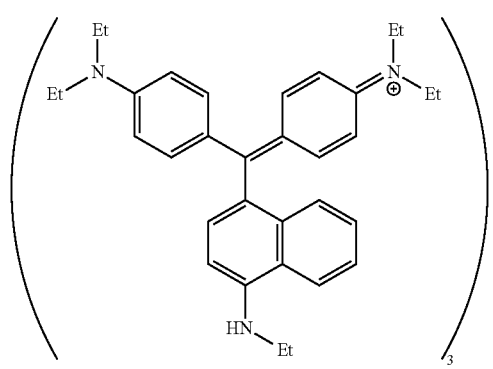

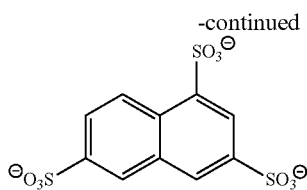

Comparative Production Example 3

Synthesis of Color Material L

First, 1.48 g (1.9 mmol) of Direct Blue 86 (manufactured by Tokyo Chemical Industry Co., Ltd.) was dissolved by heating at 50 to 55° C. in a mixture of 40 mL of methanol and 20 mL of water. Next, 1.95 g (3.8 mmol) of Basic Blue 7 (CI-42595) (manufactured by Tokyo Chemical Industry Co., Ltd.) was added thereto, and the mixture was agitated at the same temperature for 1 hour. The solution was concentrated by means of an evaporator to evaporate the methanol, and 30 mL of water was added thereto. The mixture was filtered to obtain a precipitate, and the precipitate was washed with water. The thus-obtained cake was dried under reduced pressure to obtain 2.9 g (yield 90%) of color material L represented by the following chemical formula (16).

From the following analysis result, the obtained compound was confirmed to be a desired compound.

MS (ESI) (m/z): 478(+), 369(−) (divalent)

Values of elemental analysis: CHN actual measurement values (64.02%, 4.73%, 12.89%); theoretical values (64.16%, 4.80%, 12.66%)

Chemical Formula (16)

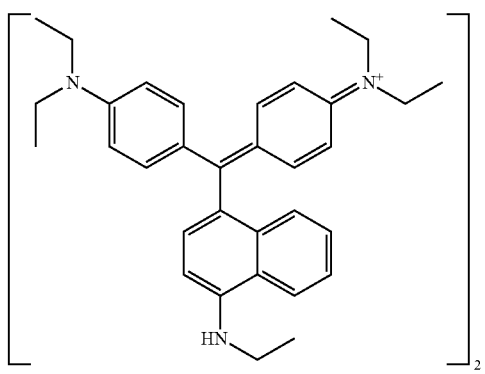

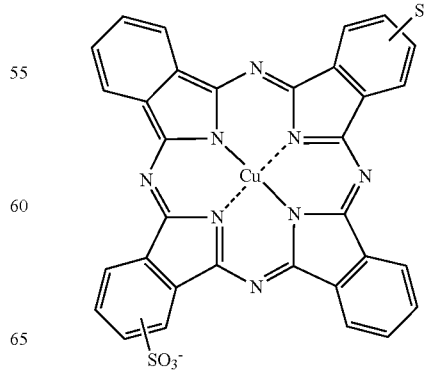

Comparative Production Example 4

Synthesis of Color Material M

First, 1.9 g (0.97 mmol) of copper(II) phthalocyanine tetrasulfonic acid tetrasodium salt (manufactured by Aldrich) was dissolved by heating at 50 to 55° C. in a mixture of 40 mL of methanol and 20 mL of water. Next, 2.00 g (3.9 mmol) of Basic Blue 7 (CI-42595) (manufactured by Tokyo Chemical Industry Co., Ltd.) was added thereto, and the mixture was agitated at the same temperature for 1 hour. The solution was concentrated by means of an evaporator to evaporate the methanol, and 30 mL of water was added thereto. The mixture was filtered to obtain a precipitate, and the precipitate was washed with water. The thus-obtained cake was dried under reduced pressure to obtain 2.5 g (yield 92%) of color material M represented by the following chemical formula (17).

From the following analysis result, the obtained compound was confirmed to be a desired compound.

MS (ESI) (m/z): 478(+), 224(−), tetravalent

Values of elemental analysis: CHN actual measurement values (70.23%, 6.12%, 9.67%); theoretical values (70.02%, 6.38%, 9.96%)

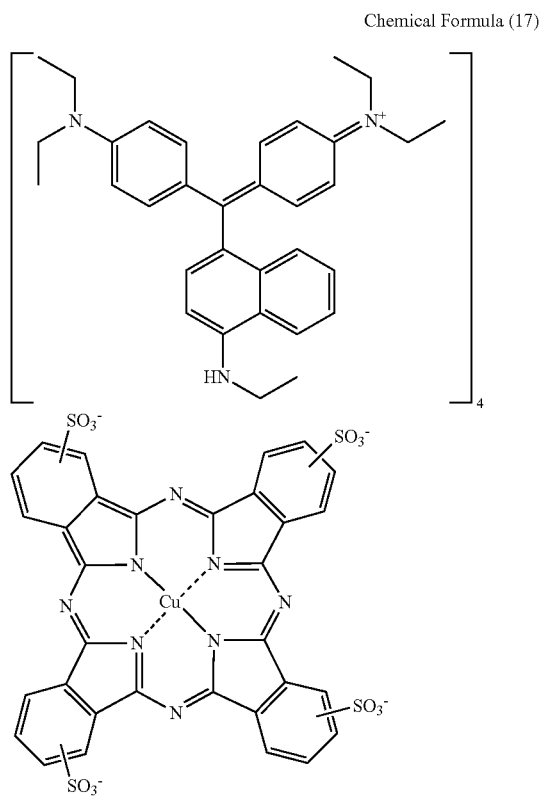

Chemical Formula (17)

Comparative Production Example 5

Synthesis of Color Material N

First, 2.76 g of poly(sodium 4-styrenesulfonate) (weight average molecular weight (Mw) up to 70,000, 30 wt % aqueous solution) (manufactured by Aldrich) was dissolved by heating at 50 to 55° C. in a mixture of 40 mL of methanol and 20 mL of water. Next, 1.88 g (3.66 mmol) of Basic Blue 7 (CI-42595) (manufactured by Tokyo Chemical Industry Co., Ltd.) was added thereto, and the mixture was agitated at the same temperature for 1 hour. The solution was concentrated by means of an evaporator to evaporate the methanol, and 30 mL of water was added thereto. The mixture was filtered to obtain a precipitate, and the precipitate was washed with water. The thus-obtained cake was dried under reduced pressure to obtain 2.0 g (yield 82%) of color material N represented by the following chemical formula (18).

From the following analysis result, the obtained compound was confirmed to be a desired compound.

MS (ESI) (m/z): 478(+)

Values of elemental analysis: CHN actual measurement values (74.49%, 7.13%, 6.24%); theoretical values (74.29%, 7.30%, 6.34%)

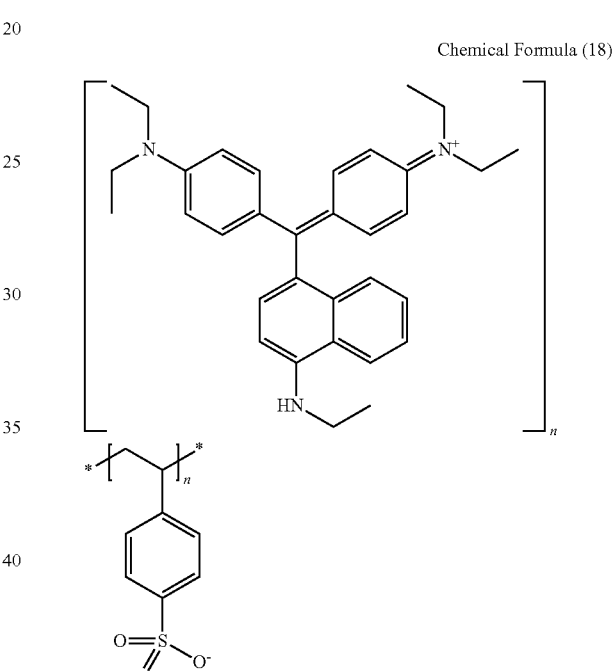

Chemical Formula (18)

Comparative Production Example 6

Synthesis of Color Material O

First, 0.92 g (2.12 mmol) of trisodium 1,3,6-naphthalenetrisulfonate and 0.48 g of poly(sodium 4-styrenesulfonate) (weight average molecular weight (Mw) up to 70,000, 30 wt % aqueous solution) (both manufactured by Tokyo Chemical Industry Co., Ltd.) were dissolved by heating at 50 to 55° C. in a mixture of 40 mL of methanol and 20 mL of water. Next, 3.29 g (6.40 mmol) of Basic Blue 7 (CI-42595) (manufactured by Tokyo Chemical Industry Co., Ltd.) was added thereto, and the mixture was agitated at the same temperature for 1 hour. The solution was concentrated by means of an evaporator to evaporate the methanol, and 30 mL of water was added thereto. The mixture was filtered to obtain a precipitate, and the precipitate was washed with water. The thus-obtained cake was dried under reduced pressure to obtain 3.5 g (yield 84%) of color material O represented by the following chemical formula (19).

From the following analysis result, the obtained compound was confirmed to be a desired compound.

MS (ESI) (m/z): 478(+), 607(−), trivalent

Values of elemental analysis: CHN actual measurement values (73.24%, 7.25%, 6.77%); theoretical values (73.02%, 7.19%, 6.81%)

Chemical Formula (19)

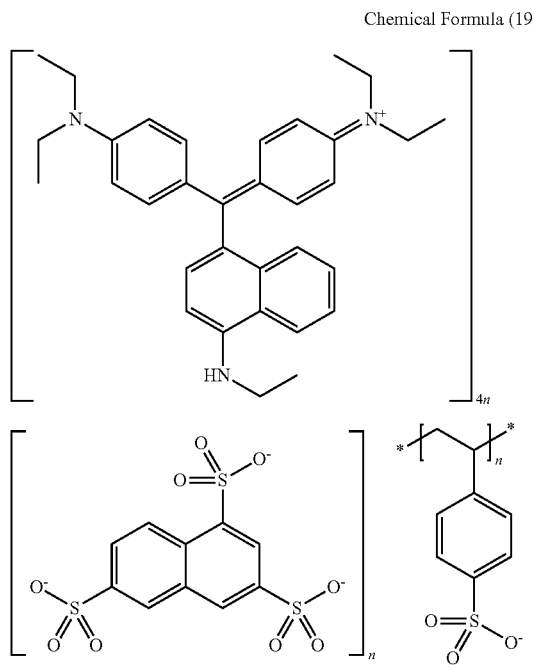

Comparative Production Example 7

Synthesis of Color Material P

First, 2.33 g (1.01 mmol) of 12-molybdo phosphoric acid n-hydrate (manufactured by Kanto Chemical Co., Inc.) was dissolved by heating at 50 to 55° C. in a mixture of 40 mL of methanol and 20 mL of water. Next, 1.56 g (3.03 mmol) of Basic Blue 7 (CI-42595) (manufactured by Tokyo Chemical Industry Co., Ltd.) was added thereto, and the mixture was agitated at the same temperature for 1 hour. The solution was concentrated by means of an evaporator to evaporate the methanol, and 30 mL of water was added thereto. The mixture was filtered to obtain a precipitate, and the precipitate was washed with water. The thus-obtained cake was dried under reduced pressure to obtain 3.1 g (yield 93%) of color material P represented by the following chemical formula (20).

From the following analysis result, the obtained compound was confirmed to be a desired compound.

MS (ESI) (m/z): 478(+), 607(−), trivalent

Values of elemental analysis: CHN actual measurement values (32.34%, 4.23%, 3.97%); theoretical values (32.26%, 4.33%, 3.84%)

Chemical Formula (20)

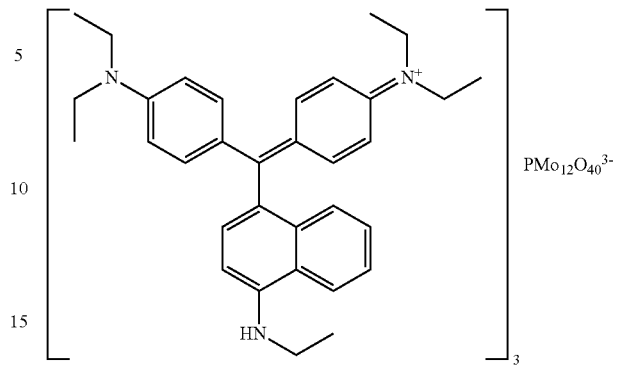

Comparative Production Example 8

Synthesis of Color Material Q

First, 6.16 g (18.67 mmol) of sodium tungstate dihydrate (manufactured by Aldrich), 1.13 g (4.67 mmol) of sodium molybdate dihydrate (manufactured by Aldrich), 0.35 g (1.945 mmol) of sodium phosphate dibasic dianhydrate, and 60 mL of water were mixed and acidified with hydrochloric acid. Next, a small amount of zinc powder was added thereto and agitated at 90 to 95° C. To this mixture, 4.0 g (7.78 mmol) of Basic Blue 7 (CI-42595) (manufactured by Tokyo Chemical Industry Co., Ltd.) was added and agitated at the same temperature for 1 hour. The solution was concentrated by means of an evaporator to evaporate the methanol, and 30 mL of water was added thereto. The mixture was filtered to obtain a precipitate, and the precipitate was washed with water. The thus-obtained cake was dried under reduced pressure to obtain 7.0 g (yield 96%) of color material Q represented by the following chemical formula (21).

From the following analysis result, the obtained compound was confirmed to be a desired compound.

MS (ESI) (m/z): 478(+), 607(−), trivalent

Values of elemental analysis: CHN actual measurement values (33.97%, 5.13%, 4.24%); theoretical values (33.89%, 5.02%, 4.35%)

Chemical Formula (21)

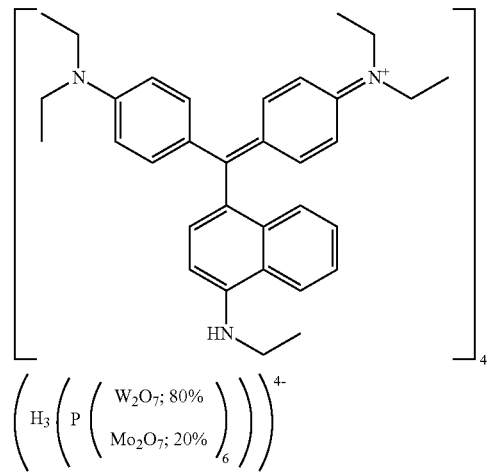

Comparative Production Example 9

Synthesis of Color Material R

In accordance with the method disclosed in Patent Literature 4, 12-molybdophosphate of polysiloxane dye was synthesized to obtain color material R.

First, 51.52 g of Basic Blue 7 (BB7) (manufactured by Tokyo Chemical Industry Co., Ltd.) was dissolved in 750 ml of ion-exchanged water. Then, an aqueous solution of 2N sodium hydroxide was added thereto, with agitation, until the deprotonated form of the dye was completely precipitated, no blue color remained in the solution and did not return for several hours. The thus-produced precipitate was filtered off, washed three times with ion-exchanged water, and then dried at 60° C. under reduced pressure (0.1 kPa). Therefore, 45.23 g (94.7%) of deprotonated BB7 was separated in the form of nearly black powder.

Separately, 50 ml of 3-iodopropyl-trimethoxysilane (manufactured by Sigma-Aldrich) and 2.0 ml (2.95 g; 10.2 mmol) of an anhydrous ethanol solution were mixed and then agitated at room temperature for 60 hours under an argon flow. Then, the solvent was distilled away under a reduced pressure to obtain 3-iodopropyl-triethoxysilane. The thus-obtained 3-iodopropyl-triethoxysilane was dissolved in 50 ml of anhydrous acetonitrile, and 2.389 g (5 mmol) of the above-mentioned deprotonated BB7 was added thereto. Then under an argon flow, the thus-obtained solution was refluxed under heating for 24 hours. After the solvent was distilled away from the solution, a semisolid residue thus obtained was washed several times with methyl-t-butyl ether, under an argon flow, to remove the excess of alkylating agent and the unreacted deprotonated dye, until the filtrate was nearly colorless. A solid residue was separated therefore, which is silanized BB7. Then, 1 g of the silanized BB7 was dissolved in 25 ml of anhydrous ethanol to obtain a silanized BB7 solution.

Then, 25 ml of the silanized BB7 solution was added to a mixed solvent of 150 ml of ethanol (96%), 50 ml of water and 30 g of a 25% ammonia aqueous solution and agitated vigorously at room temperature for 24 hours to form seed particles. Then, the mixture was subjected to centrifugation. A residue thus obtained was dispersed in ethanol (80%) and subjected to three cycles of washing and centrifugation. Thereafter, the solvent was removed therefrom to obtain a residue. The thus-obtained residue was dispersed in dimethyl sulfoxide (DMSO), added in 400 ml of deionized water and agitated. Furthermore, 12-molybdo phosphoric acid n-hydrate was added thereto, thereby obtaining color material R of Comparative production example 9.

<Evaluation: Insolubility in Solvent>

First, 0.1 g of each of color materials A to R was put in 10 g of PGMEA in a 20 mL sample tube. The sample tube was covered with a lid, shaken well for 20 seconds and then left for 10 minutes. Then, 5 g of the supernatant was filtered to remove insoluble substances. The thus-obtained filtrate was measured for absorption spectrum, using a 1 cm cell in an ultraviolet and visible spectrophotometer (UV-2500PC manufactured by Shimadzu Corporation) to calculate the absorbance (595 nm) at the wavelength of 595 nm.

If the absorbance (595 nm) measured under the above condition is 2 or less, it can be said that PGMEA is a solvent which does not substantially dissolve the color material. The results are shown in Table 1.

o: Absorbance (595 nm)≤2
x: Absorbance (595 nm)>2

TABLE 1

Table 1. Insolubility of color material

| | Color material | Solvent | Insolubility |
|---|---|---|---|
| Example 1 | A | PGMEA | o |
| Example 2 | B | PGMEA | o |
| Example 3 | C | PGMEA | o |
| Example 4 | D | PGMEA | o |
| Example 5 | E | PGMEA | o |
| Example 6 | F | PGMEA | o |
| Example 7 | G | PGMEA | o |
| Example 8 | H | PGMEA | o |
| Example 9 | I | PGMEA | o |

Color materials A to I were not substantially dissolved in PGMEA. From the above results, it can be said that PGMEA is a solvent which does not substantially dissolve color materials A to I.

Color materials A to I were dispersible in PGMEA. Also, color materials J to R obtained in Comparative production examples 1 to 9 were not substantially dissolved in PGMEA and were dispersible in PGMEA.

Example 1

Preparation of Color Material Dispersion Liquid (A)

First, 1.0 part by mass of color material A of Production Example 1, 0.6 part by mass of AJISPER PB821 (manufactured by Ajinomoto Fine-Techno. Co., Inc.), 8.4 parts by mass of propylene glycol monomethyl ether acetate (PGMEA, manufactured by DAICEL Chemical Industries, Ltd.) and 2.0 parts by mass of zirconia beads with a diameter of 2 mm were put in a 30 ml mayonnaise jar and pre-pulverized for 1 hours by means of a paint shaker (manufactured by Asada Iron Works Co., Ltd.) Then, the solution was moved to another 30 ml mayonnaise jar, followed by addition of 2.0 parts by mass of zirconia beads having a diameter of 0.1 mm. Then, the jar was shaken for 20 hours by means of the paint shaker to obtain color material dispersion liquid (A) of Example 1. Then, 0.1 part by mass of the thus-obtained color material dispersion liquid (A) was diluted with 9.9 parts by mass of PGMEA and measured for particle size distribution with a microtrac UPA particle size analyzer (manufactured by Nikkiso Co., Ltd.) Evaluation was conducted using 50% average particle diameter. The average dispersed particle size of the color material in the color material dispersion liquid (A) was found to be 114 nm, in terms of volume (MV).

Examples 2 to 9

Preparation of Color Material Dispersion Liquids (B) to (I)

Color material dispersion liquids of (B) to (I) of Examples 2 to 9 were obtained in the same manner as Example 1, except that color materials B to I were used in place of color material A. Then, 0.1 part by mass of each of the obtained color material dispersion liquids (B) to (I) was diluted with 9.9 parts by mass of PGMEA and measured for particle size distribution with the microtrac UPA particle size analyzer (manufactured by Nikkiso Co., Ltd.) Evaluation was conducted using 50% average particle diameter, and the results in terms of volume (MV) are shown in Table 2.

Comparative Examples 1 to 9

Preparation of Color Material Dispersion Liquids (J) to (R)

Color material dispersion liquids (J) to (R) of Comparative Examples 1 to 9 were obtained in the same manner as Example 1, except that color materials J to R were used in place of color material A. Then, 0.1 part by mass of each of the obtained color material dispersion liquids (J) to (R) was diluted with 9.9 parts by mass of PGMEA and measured for particle size distribution with the microtrac UPA particle size analyzer (manufactured by Nikkiso Co., Ltd.) Evaluation was conducted using 50% average particle diameter, and the results in terms of volume (MV) are shown in Table 2.

(Preparation of Color Resin Composition for Color Filters)

First, 3.31 parts by mass of color material dispersion liquid (A) of Example 1 was mixed with the following: 2.07 parts by mass of a methacrylic acid/methyl methacrylate/benzyl methacrylate copolymer (molar ratio: Oct. 30, 1950, mass average molecular weight: 9,000, acid value: 70 mgKOH/g, active substance content: 40% by mass); 0.59 part by mass of a dipentaerythritol hexaacrylate monomer ("ARONIX M-403" manufactured by TOAGOSEI Co., Ltd.); 0.38 part by mass of IRGACURE 907 (manufactured by Ciba Specialty Chemicals, Inc.); 0.08 part by mass of KAYACURE DETX-S (manufactured by Nippon Kayaku Co., Ltd.); 0.03 part by mass of KBM503 (manufactured by Shin-Etsu Chemical Co., Ltd.); 0.0003 part by mass of MEGAFACE R08MH (manufactured by DIC Corporation); and 9.09 parts by mass of PGMEA. The mixture was agitated and filtered with a 0.25 μm mesh to obtain a color resin composition for color filters.

Color resin compositions for color filters were obtained in the same manner as Example 1, except that the color material dispersion liquids of Examples 2 to 9 and Comparative Examples 1 to 9 were used in place of color material dispersion liquid (A) of Example 1.

<Evaluation: Contrast>

Each of the color resin composition for color filters obtained from the color material dispersion liquids of Examples 1 to 9 and Comparative Examples 1 to 9, was spin-coated onto a glass substrate at 700 rpm for 5 seconds and then heated on a hot plate at 80° C. for 3 minutes.

In the air, the substrate was exposed to light with Ultra High Pressure Mercury Lamp UI-501C manufactured by Ushio Inc., at a gap of 150 μm. The exposure amount was measured with an accumulated UV meter UIT-102 and a detector UVD-365PD, both manufactured by Ushio Inc., and found to be 100 mJ/cm². The thus-obtained coating film was left at 200° C. for 30 minutes, and the contrast value of the thus-produced glass substrate was measured with a contrast measuring device "CT-1B" manufactured by Tsubosaka Electric Co., Ltd. The larger the contrast value, the smaller the light scattering degree, so that there is a decrease in leaked light when used as the color filter of a liquid display device, providing a clear contrast to a liquid crystal panel.

To increase the contrast, the coating film is needed to be uniform. The non-uniform coating film showing crystal precipitation or phase separation has a small contrast value. The measurement results are shown in Table 2.

<Evaluation: NMP Resistance>

Each of the color resin composition for color filters obtained from the color material dispersion liquids of Examples 1 to 9 and Comparative Examples 1 to 9, was spin-coated onto a glass substrate at 700 rpm for 5 seconds and then heated on a hot plate at 80° C. for 3 minutes. The thus-obtained coating film was cured by exposure to light with a high pressure mercury lamp; thereafter, the film was sufficiently cured by heating at 200° C. for 60 minutes, followed by evaluation of N-methylpyrrolidone (NMP) resistance of the film.

The NMP resistance was evaluated as follows. A drop of NMP was put on the coating film, left for 5 minutes and then wiped away with a wiping cloth (BEMCOT LINT FREE AZ-8 manufactured by Guardner Corporation). The spectroscopy of the coating film before and after the NMP addition, that is, ΔEab value, was measured with a microscopic spectrophotometer OSP-SP200 manufactured by Olympus Corporation. Based on the color difference calculated from the thus-obtained result, the NMP resistance was evaluated. It can be said that the smaller the color difference, the smaller the elution by NMP and thus the higher the NMP resistance. The measurement results are shown in Table 2.

<Evaluation: Electric Reliability>

(Production of Measurement Cell)

A measurement cell 300 is shown in FIG. 6, which was used for evaluation of electric reliability.

Each of the color resin compositions for color filters obtained from the color material dispersion liquids of Examples 1 to 9 and Comparative Examples 1 to 9, was applied to an ITO electrode 303 side of an ITO substrate 301 with a spin coater and then pre-baked to form a coating film having a thickness of 2.0 to 2.4 μm. Then, the coating film was exposed to ultraviolet light containing wavelengths of 365 nm, 405 nm and 436 nm at an exposure amount of 60 mJ/cm² in a given pattern. Thereafter, the coating film was developed with a spin developing machine at 23° C. for 1 minute, using a 0.04% by mass potassium hydroxide aqueous solution, washed with pure water for 1 minute, dried and then dried, followed by post-baking of the substrate, thereby producing a coating film 307 comprising the color resin composition. Next, another ITO substrate 304 was faced thereto so that the distance between the ITO electrodes was 5 to 15 μm. The periphery was encapsulated with a sealing member 309, followed by injection of a liquid crystal 308 into between the ITO substrates, thereby producing the liquid crystal cell 300 for measurement. After the measurement cell 300 was left in an oven at 105° C. for 2.5 hours, the cell was cooled to room temperature to measure the voltage holding ratio by the below-described method.

As shown in FIG. 6, the measurement cell 300 has a layered structure that the following components are layered in this sequence: the indium tin oxide (ITO) substrate 301 comprising a glass substrate 302 and the ITO electrode 303 provided on the glass substrate/the coating film 307 comprising the color resin composition/the liquid crystal 308/the ITO substrate 304 comprising a glass substrate 305 and the ITO electrode 306 provided on the glass substrate.

—Measurement of Voltage Holding Ratio—

The voltage holding ratio was measured with a voltage holding ratio measurement system (model VHR-1A manufactured by TOYO Corporation) in the following conditions. The measurement results are shown in Table 2. One having a voltage holding ratio of 80% or more can be evaluated as one having a high electric reliability.

(Conditions)

Distance between ITO electrodes: 5 μm
Impressed voltage pulse amplitude: 5 V
Impressed voltage pulse frequency: 60 Hz
impressed voltage pulse width: 16.67 msec The evaluation results for contrast, NMP resistance and electric reliability are shown in Table 2.

TABLE 2

| | a | c | Dispersion liquid | Average particle diameter (nm) | Contrast | NMP resistance Color difference ΔEab | Voltage holding ratio (%) |
|---|---|---|---|---|---|---|---|
| Example 1 | 2 | 2 | A | 114.0 | 7500 | 0.16 | 87% |
| Example 2 | 2 | 3 | B | 96.9 | 7200 | 0.12 | 90% |
| Example 3 | 2 | 3 | C | 125.3 | 7300 | 0.15 | 88% |
| Example 4 | 2 | 2 | D | 155.1 | 7000 | 0.54 | 86% |
| Example 5 | 2 | 4 | E | 121.2 | 6500 | 0.63 | 89% |
| Example 6 | 2 | 300 | F | 111.2 | 5500 | 0.23 | 90% |
| Example 7 | 2 | 3 + 300 | G | 123.2 | 7400 | 0.10 | 92% |
| Example 8 | 2 | 3 | H | 136.2 | 6500 | 0.23 | 88% |
| Example 9 | 2 | 4 | I | 133.5 | 7300 | 0.11 | 89% |
| Comparative Example 1 | 1 | 2 | J | 80.0 | 1000 | 7.0 | 63% |
| Comparative Example 2 | 1 | 3 | K | 120.3 | 3000 | 9.2 | 73% |
| Comparative Example 3 | 1 | 2 | L | 162.3 | 600 | 6.5 | 52% |
| Comparative Example 4 | 1 | 4 | M | 122.2 | 600 | 6.2 | 56% |
| Comparative Example 5 | 1 | 300 | N | 136.3 | 300 | 7.2 | 66% |
| Comparative Example 6 | 1 | 3 + 300 | O | 128.9 | 1000 | 8.5 | 62% |
| Comparative Example 7 | 1 | 3 | P | 168.2 | 1750 | 6.2 | 59% |
| Comparative Example 8 | 1 | 4 | Q | 182.2 | 1900 | 7.2 | 55% |
| Comparative Example 9 | ≥1 | 3 | R | 562.2 | 153 | 3.1 | 75% |

The following are clear from the results shown in Table 2.

It is clear that the color materials A to I of Examples 1 to 9, each of which comprises the combination of divalent or trivalent anions with a color material precursor comprising divalent cations, have higher contrast than Comparative Examples 1 to 9; moreover, the color materials of Example 1 to 9 have higher NMP solvent resistance and higher electric reliability. The reason is thought as follows: in the color materials A to I of Examples 1 to 9, each comprising divalent or higher cations and anions, formation of molecular associations as shown in FIG. 4 exerted an effect to increase the apparent molecular weight; moreover, due to an increase in the cohesion in a solid state, there was a decrease in the motion of the cations and anions in the coating film, resulting in inhibition of a decrease in contrast of the coating film due to re-aggregation or precipitation of fine particles comprising the ion pairs, and inhibition of elution of ion components from the coating film.

Also, the color materials A to I, each comprising the combination of divalent or trivalent anions with a color material precursor comprising divalent cations, showed excellent dispersion properties. This is thought to be because the cohesion state of the molecular associations as shown in FIG. 4 contributed to the higher dispersion properties.

Comparative Example 9 comprising the color material R was inferior to Examples 1 to 9 in all of contrast, NMP solvent resistance and electric reliability. The color material R of Comparative Example 9 includes highly-polymerized, high-molecular-weight components derived from the polysiloxane dye cations, and unreacted dye cations. The reason why Comparative Example 9 had poor dispersion properties is thought to be due to a non-uniformity in dispersed particle size, which is attributed to such a non-uniform molecular weight distribution, and the presence of coarse particles, which are attributed to the high-molecular-weight components. Also, it is thought that when heated at high temperature, the silanol and alkoxysilyl groups in the color material R are reacted to aggregate the color material. It is thought that due to these reasons, Comparatives Example 9 showed a remarkably inferior contrast. In the color material R, the unreacted dye cations were present in the form of monovalent cations. The reason why Comparative Example 9 had poor NMP solvent resistance and poor electric reliability is thought to be because such monovalent cations did not form the molecular associations as shown in FIG. 4.

REFERENCE SIGNS LIST

1. Transparent substrate
2. Light shielding part
3. Color layer
10. Color filter
20. Counter substrate
30. Liquid crystal layer
40. Liquid crystal display device
50. Organic protection layer
60. Inorganic oxide layer
71. Transparent positive electrode
72. Positive hole injection layer
73. Positive hole transport layer
74. Light-emitting layer
75. Electron injection layer
76. Negative electrode
80. Organic light-emitting material
100. Organic light-emitting display device
201. Divalent or higher counter cation
202. Divalent or higher counter anion
203. Linkage by A
204. Ionic bond
205. Cation
206. Conventional dye salt-forming compound
210. Molecular association of the color material of the present invention
300. Liquid crystal cell for measurement
301. ITO substrate
302. Glass substrate
303. ITO electrode

304. ITO substrate
305. Glass substrate
306. ITO electrode
307. Coating film
308. Liquid crystal
309. Sealing member

The invention claimed is:

1. A color filter comprising at least a transparent substrate and color layers present on the substrate, wherein at least one of the color layers is a color layer which is a cured product of a color resin composition for color filters, the composition comprising a color material represented by the following general formula (I), a dispersant, a binder component and a solvent having a solubility of the color material of 0.1 (mg/10 g solvent) or less at 23° C., and wherein the color layer has a voltage holding ratio of 86% or more and 92% or less:

General Formula (I)

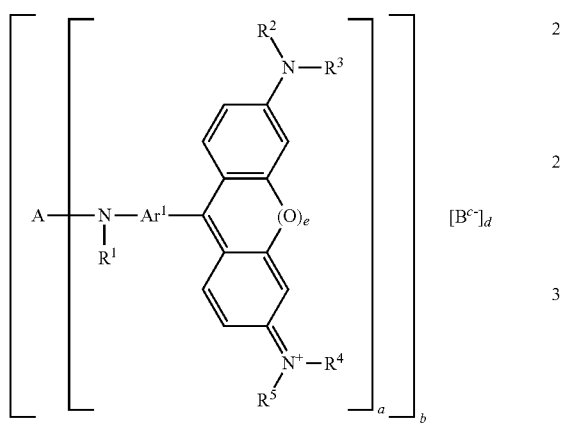

wherein A is an "a"-valent organic group in which a carbon atom directly bound to N has no π bond, and the organic group is a bridged alicyclic hydrocarbon group having a saturated aliphatic hydrocarbon group at least at a terminal position directly bound to N, or an aromatic group having an aliphatic hydrocarbon group having a saturated aliphatic hydrocarbon group at least at a terminal position directly bound to N, and O, S, N may be contained in a carbon chain of the organic group; $B^{c-}$ is a "c"-valent anion; each of $R^1$ to $R^5$ is independently a hydrogen atom, an alkyl group which may have a substituent, or an aryl group which may have a substituent; $R^2$ and $R^3$ may be bound to form a ring structure, and/or $R^4$ and $R^5$ may be bound to form a ring structure; $Ar^1$ is a divalent aromatic group which may have a substituent; $R^1$s may be the same or different; $R^2$s may be the same or different; $R^3$s may be the same or different; $R^4$s may be the same or different; $R^5$s may be the same or different; and $Ar^1$s may be the same or different; and wherein each of "a" and "c" is an integer of 2 or more; each of "b" and "d" is an integer of 1 or more; "e" is 0 or 1 and there is no bond when "e" is 0; and "e"s may be the same or different.

2. A liquid crystal display device comprising the color filter defined by claim 1, a counter substrate, and a liquid crystal layer present between the color filter and the counter substrate.

3. An organic light-emitting display device comprising the color filter defined by claim 1 and an organic light-emitting material.

* * * * *